(12) United States Patent
Morise et al.

(10) Patent No.: US 10,276,224 B2
(45) Date of Patent: Apr. 30, 2019

(54) MAGNETIC MEMORY HAVING METAL PORTIONS AND MAGNETIC MEMORY ARRAY INCLUDING SAME

(71) Applicant: TOSHIBA MEMORY CORPORATION, Tokyo (JP)

(72) Inventors: Hirofumi Morise, Kanagawa (JP); Tsuyoshi Kondo, Kanagawa (JP); Nobuyuki Umetsu, Kanagawa (JP); Yasuaki Ootera, Kanagawa (JP); Susumu Hashimoto, Tokyo (JP); Masaki Kado, Kanagawa (JP); Takuya Shimada, Kanagawa (JP); Michael Arnaud Quinsat, Kanagawa (JP); Shiho Nakamura, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/700,769

(22) Filed: Sep. 11, 2017

(65) Prior Publication Data

US 2018/0254076 A1    Sep. 6, 2018

(30) Foreign Application Priority Data

Mar. 2, 2017    (JP) .................................. 2017-039600

(51) Int. Cl.
  *G11C 11/16*    (2006.01)
  *H01L 43/08*    (2006.01)
  *G11C 19/08*    (2006.01)

(52) U.S. Cl.
  CPC ........ *G11C 11/161* (2013.01); *G11C 11/1655* (2013.01); *G11C 11/1673* (2013.01);
  (Continued)

(58) Field of Classification Search
  CPC .............. G11C 11/161; G11C 11/1655; G11C 11/1659; G11C 11/16; H01L 43/08; H01L 41/12
  See application file for complete search history.

(56) References Cited

U.S. PATENT DOCUMENTS 8,406,029 B2 *  3/2013  Kim ........................ G11C 11/14
                                                       365/80
9,117,523 B1    8/2015  Morris et al.
(Continued)

FOREIGN PATENT DOCUMENTS

JP    2009-239135    10/2009
JP    2012-204802    10/2012
(Continued)

*Primary Examiner* — David Lam
(74) *Attorney, Agent, or Firm* — Finnegan, Henderson, Farabow, Garrett & Dunner, L.L.P.

(57) ABSTRACT

According to an embodiment, a magnetic memory includes a first magnetic portion, a second magnetic portion, a first nonmagnetic portion, and a controller. The first magnetic portion includes a first portion and a second portion. The controller in a first operation supplies a first current from the first portion toward the second portion. The controller in a second operation supplies a second current to from the second portion toward the first portion. A first electrical resistance value can be different from a second electrical resistance value. The first electrical resistance value is between the second magnetic portion and the portion of the first magnetic portion before the first operation and the second operation are performed. The second electrical resistance value is between the second magnetic portion and the portion of the first magnetic portion after the first operation and the second operation are performed.

17 Claims, 19 Drawing Sheets

(52) U.S. Cl.
CPC ...... *G11C 11/1675* (2013.01); *G11C 19/0841* (2013.01); *H01L 43/08* (2013.01); *G11C 11/1659* (2013.01)

(56) References Cited

U.S. PATENT DOCUMENTS

| | | | |
|---|---|---|---|
| 2008/0080092 A1* | 4/2008 | Kim | G11B 5/255 360/110 |
| 2012/0250398 A1 | 10/2012 | Morise et al. | |
| 2012/0250406 A1 | 10/2012 | Morise et al. | |
| 2014/0050015 A1* | 2/2014 | Katoh | G11C 13/004 365/148 |
| 2014/0085970 A1 | 3/2014 | Kondo et al. | |
| 2014/0104941 A1 | 4/2014 | Kondo et al. | |
| 2015/0036422 A1 | 2/2015 | Morise et al. | |
| 2016/0247550 A1 | 8/2016 | Fukami et al. | |

FOREIGN PATENT DOCUMENTS

| | | |
|---|---|---|
| JP | 2012-212715 | 11/2012 |
| JP | 2014-63936 | 4/2014 |
| JP | 2014-78617 | 5/2014 |
| JP | 2014-103260 | 6/2014 |
| JP | 2015-29024 | 2/2015 |
| WO | 2015/068509 | 5/2014 |

\* cited by examiner

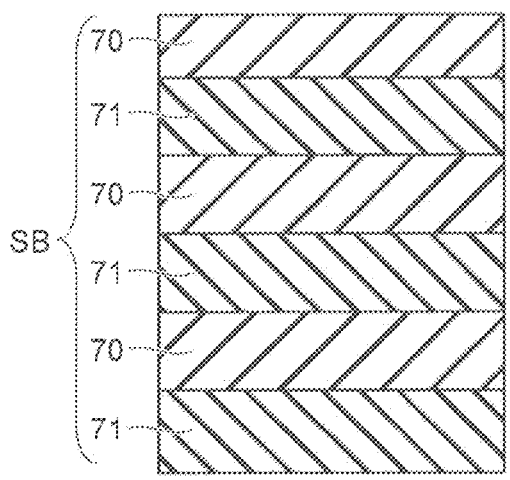
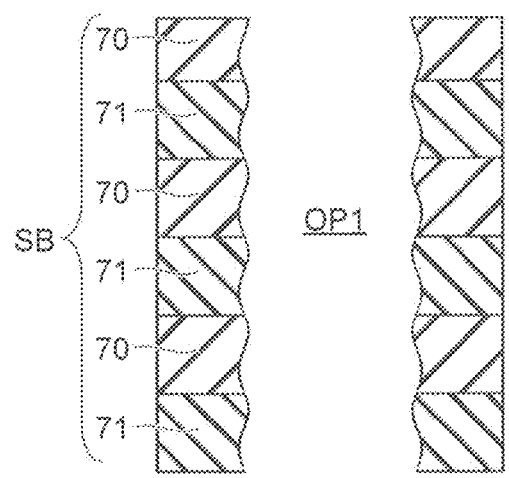
FIG. 13A
FIG. 13B
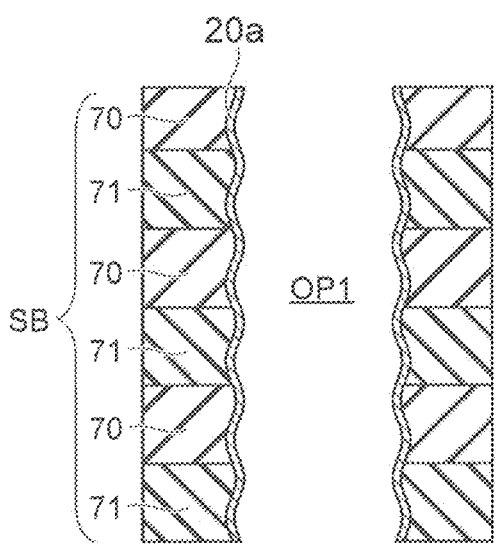
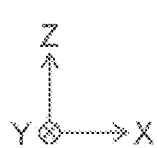
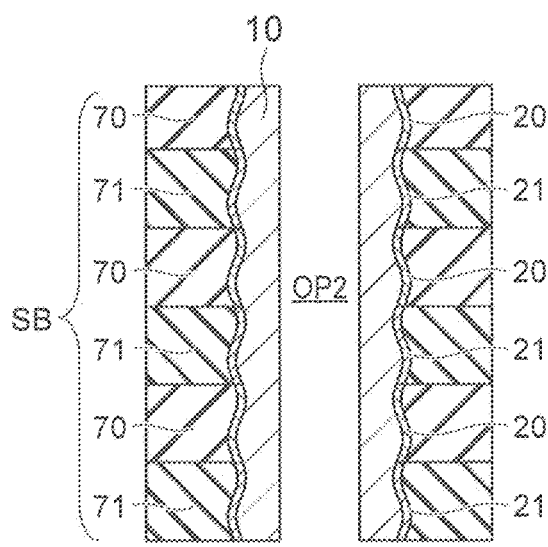
FIG. 13C
FIG. 13D

MAGNETIC MEMORY HAVING METAL PORTIONS AND MAGNETIC MEMORY ARRAY INCLUDING SAME

CROSS REFERENCE TO RELATED APPLICATIONS

This application is based upon and claims the benefit of priority from Japanese Patent Application No. 2017-039600, filed on Mar. 2, 2017; the entire contents of which are incorporated herein by reference.

FIELD

Embodiments described herein relate generally to a magnetic memory and a magnetic memory array.

BACKGROUND

Stable operations are desirable for a magnetic memory and a magnetic memory array that use domain walls.

BRIEF DESCRIPTION OF THE DRAWINGS

FIG. 13A to FIG. 13D are cross-sectional views illustrating an example of a method for manufacturing the magnetic memory according to the third embodiment;

DETAILED DESCRIPTION

Figure 1:
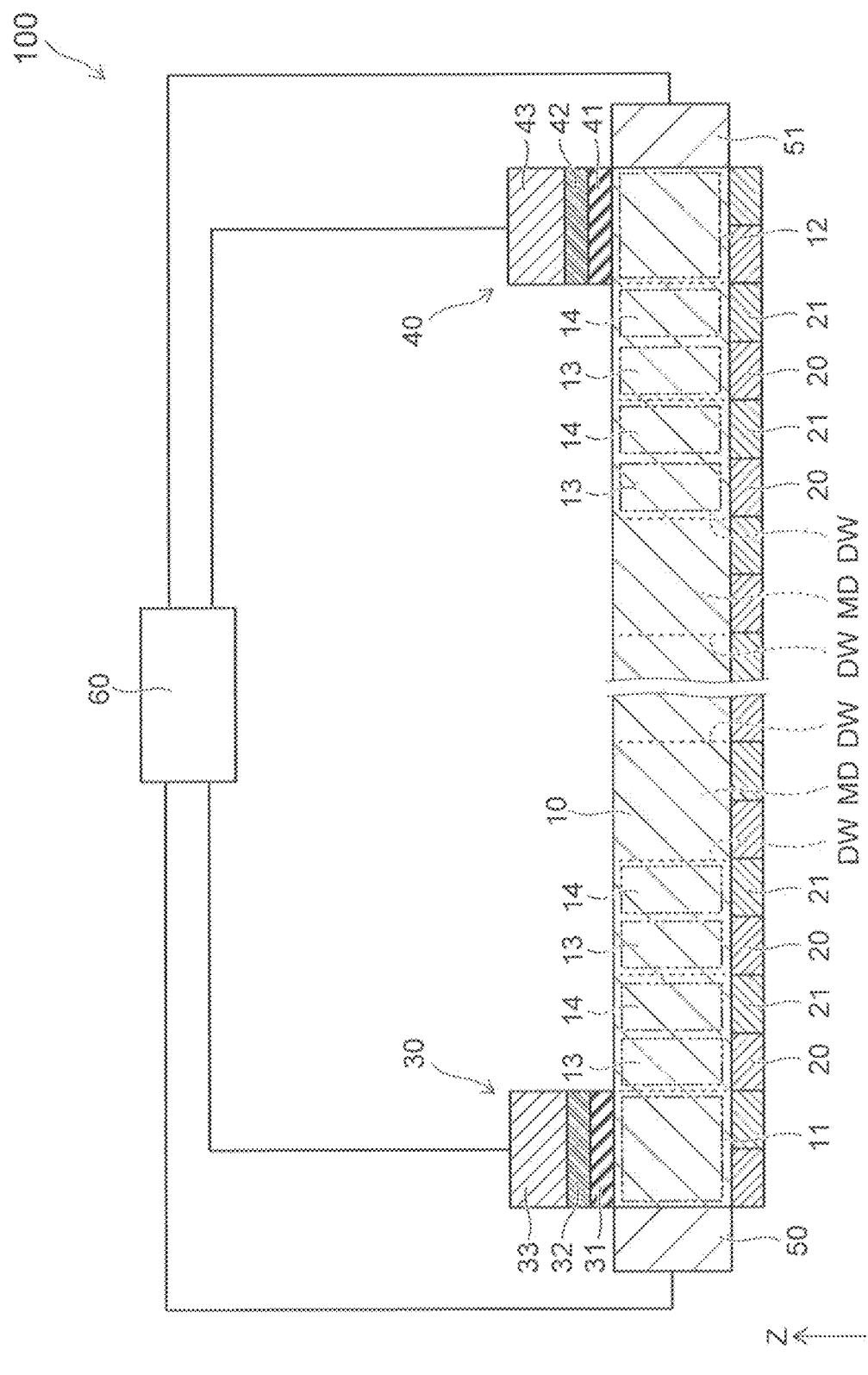
FIG. 1 is a cross-sectional view illustrating an example of a magnetic memory according to a first embodiment.

According to an embodiment, a magnetic memory includes a first magnetic portion, a second magnetic portion, a first nonmagnetic portion, and a controller. The first magnetic portion includes a first portion and a second portion. The first nonmagnetic portion is provided between the second magnetic portion and a portion of the first magnetic portion. The controller performs a first operation and a second operation. The controller is electrically connected to the first portion and the second portion. The controller in the first operation supplies a first current to the first magnetic portion from the first portion toward the second portion. The controller in the second operation after the first operation supplies a second current to the first magnetic portion from the second portion toward the first portion. A first electrical resistance value can be different from a second electrical resistance value. The first electrical resistance value is between the second magnetic portion and the portion of the first magnetic portion before the first operation and the second operation are performed. The second electrical resistance value is between the second magnetic portion and the portion of the first magnetic portion after the first operation and the second operation are performed.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

FIG. 1 is a cross-sectional view illustrating an example of a magnetic memory 100 according to a first embodiment.

As illustrated in FIG. 1, the magnetic memory 100 includes a first magnetic portion 10, a first metal portion 20, a second metal portion 21, a read portion 30, a write portion 40, a first electrode 50, a second electrode 51, and a controller 60.

The first magnetic portion 10 includes a first portion 11, a second portion 12, a third portion 13, and a fourth portion 14. The first magnetic portion 10 extends in a first direction connecting the first portion 11 and the second portion 12. The first direction is, for example, an X-direction illustrated in FIG. 1. The first direction is described as the X-direction in the description of the embodiments recited below.

The third portion 13 is multiply provided in the X-direction. The fourth portion 14 is multiply provided in the X-direction. The multiple third portions 13 and the multiple fourth portions 14 are provided alternately in the X-direction.

The first magnetic portion 10 includes multiple magnetic domains MD. The multiple magnetic domains MD are arranged along the X-direction. Domain walls DW exist between the mutually-adjacent magnetic domains MD. At the domain wall DW, the orientations of the magnetizations of the two mutually-adjacent magnetic domains MD change continuously. The direction of the easy magnetization axis of the first magnetic portion 10 is aligned with, for example, a second direction crossing the X-direction. The orientations of the magnetizations of the magnetic domains MD are aligned with the second direction. The second direction is, for example, a Z-direction illustrated in FIG. 1. The second direction is described as the Z-direction in the description of the embodiments recited below.

The first metal portion 20 is multiply provided in the X-direction. The second metal portion 21 is multiply provided in the X-direction. The multiple first metal portions 20 and the multiple second metal portions 21 are provided alternately in the X-direction.

The metal material that is included in the first metal portion 20 is different from the metal material included in the second metal portion 21. Or, the first metal portion 20 and the second metal portion 21 may include the same metal material; and only the first metal portion 20 may further include another metal material. Or, the first metal portion 20 and the second metal portion 21 may include the same metal material; and only the second metal portion 21 may further include another metal material.

The multiple first metal portions 20 respectively overlap the multiple third portions 13 in the Z-direction. The multiple first metal portions 20 may further overlap the multiple third portions 13 respectively in a third direction crossing the X-direction and the Z-direction. For example, the multiple first metal portions 20 respectively contact the multiple third portions 13. The third direction is, for example, a Y-direction illustrated in FIG. 1. The third direction is described as the Y-direction in the description of the embodiments recited below.

The multiple second metal portions 21 respectively overlap the multiple fourth portions 14 in the Z-direction. The multiple second metal portions 21 may further overlap the multiple fourth portions 14 respectively in the Y-direction. For example, the multiple second metal portions 21 respectively contact the multiple fourth portions 14.

For example, the read portion 30 is connected to the first portion 11. The read portion 30 reads the orientation (the magnetization information) of the magnetization of the magnetic domain MD positioned at the first portion 11. For example, the write portion 40 is connected to the second portion 12. The write portion 40 writes magnetization information to the second portion 12 by controlling the orientation of the magnetization of the second portion 12 to be an orientation corresponding to the magnetization information to be written. The positions where the read portion 30 and the write portion 40 are connected to the first magnetic portion 10 are not limited to the example illustrated in FIG. 1 and are modifiable as appropriate. Another magnetic portion may be provided between the read portion 30 and the first magnetic portion 10 and between the write portion 40 and the first magnetic portion 10; and the reading and writing of the magnetization information from and to the first magnetic portion 10 may be performed via the magnetic portions.

The read portion 30 includes, for example, a first nonmagnetic portion 31, a second magnetic portion 32, and a third electrode 33. The write portion 40 includes, for example, a second nonmagnetic portion 41, a third magnetic portion 42, and a fourth electrode 43. In the case where the orientations of the magnetizations of the magnetic domains MD of the first magnetic portion 10 are aligned with the Z-direction, for example, the orientation of the magnetization of the second magnetic portion 32 and the orientation of the magnetization of the third magnetic portion 42 are aligned with the Z-direction. The orientation of the magnetization of the second magnetic portion 32 and the orientation of the magnetization of the third magnetic portion 42 change less easily than the orientations of the magnetizations of the magnetic domains MD included in the first magnetic portion 10.

The first electrode 50 is electrically connected to the first portion 11. The second electrode 51 is electrically connected to the second portion 12. The third electrode 33, the fourth electrode 43, the first electrode 50, and the second electrode 51 are electrically connected to the controller 60. The controller 60 can cause a current to flow between these electrodes.

When the magnetization information stored in the first magnetic portion 10 is read, for example, the controller 60 causes the current to flow between the third electrode 33 and the first electrode 50. In the case where the orientation of the magnetization of the magnetic domain MD positioned at the first portion 11 is the same as (parallel to) the orientation of the magnetization of the second magnetic portion 32, the electrical resistance value between the third electrode 33 and the first electrode 50 is relatively small. In the case where the orientation of the magnetization of the magnetic domain MD positioned at the first portion 11 is the reverse of (antiparallel to) the orientation of the magnetization of the second magnetic portion 32, the electrical resistance value between the third electrode 33 and the first electrode 50 is relatively large. The read portion 30 reads the magnetization information of the first portion 11 by reading the change of the electrical resistance value.

When information is written to the first magnetic portion 10, for example, the controller 60 causes a current to flow from the fourth electrode 43 toward the second electrode 51. A spin-polarized electron current flows in the orientation of the magnetization of the third magnetic portion 42 when electrons flow from the second electrode 51 toward the first magnetic portion 10. The orientation of the magnetization of the second portion 12 is controlled by the spin-polarized electron current; and the magnetization information is written.

The controller 60 causes a current to flow between the first electrodes 50 and 51 when moving the domain walls DW included in the first magnetic portion 10. The inventors discovered the following for the magnetic memory 100. The domain walls DW (the magnetic domains MD) of the third portions 13 overlapping the first metal portions 20 move along the orientation of the current when the current is caused to flow between the first electrode 50 and the second electrode 51 by the controller 60. The domain walls DW (the magnetic domains MD) of the fourth portions 14 overlapping the second metal portions 21 move along the reverse orientation of the current when the current is caused to flow between the first electrode 50 and the second electrode 51 by the controller 60.

Figure 2:
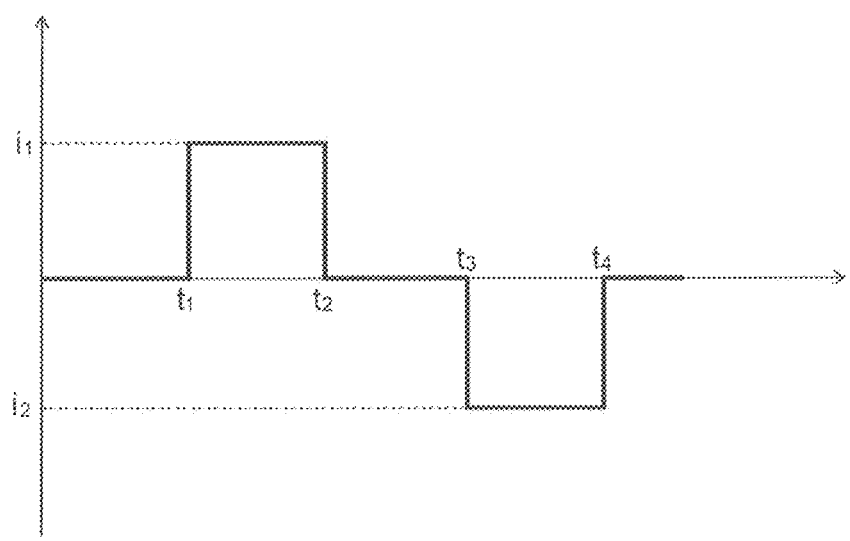
FIG. 2 is a graph illustrating an example of the relationship between time and the orientation of the current supplied to the first magnetic portion.

FIG. 2 is a graph illustrating an example of the relationship between time and the orientation of the current supplied to the first magnetic portion 10.

In FIG. 2, the horizontal axis is time; and the vertical axis is a current value. In FIG. 2, the current that flows from the first electrode 50 to the second electrode 51 is taken to be positive; and the current that flows from the second electrode 51 to the first electrode 50 is taken to be negative.

By utilizing the phenomenon described above, the inventors devised the following method for moving the domain walls DW.

The controller 60 moves the domain walls DW by performing a first operation and a second operation. In the first operation from a time $t_1$ to a time $t_2$, the controller 60 causes a first current having a first current value $i_1$ to flow from the first portion 11 toward the second portion 12. The domain walls DW of the third portions 13 are moved toward the second portion 12 by the first operation. In the second operation from a time $t_3$ to a time $t_4$, the controller 60 causes a second current having a second current value $i_2$ to flow from the second portion 12 toward the first portion 11. The domain walls DW of the fourth portions 14 are moved toward the second portion 12 by the second operation.

The domain walls DW move from the first portion 11 toward the second portion 12 in both the first operation and the second operation. The domain walls DW can be moved toward the second portion 12 by alternately performing the first operation and the second operation. During the first operation, the domain walls DW that move through the third portions 13 do not enter the fourth portions 14. During the second operation, the domain walls DW that move through the fourth portions 14 do not enter the third portions 13. This is because the movement direction of the domain walls DW with respect to the orientation in which the current flows is different between the third portions 13 and the fourth portions 14.

For example, in the case where one magnetic domain MD exists in one third portion 13 and one fourth portion 14, the magnetization information of one bit can be moved toward the second portion 12 by performing the first operation and the second operation one time each.

According to the magnetic memory 100 according to the embodiment, the domain walls DW can be stopped at the boundary portions between the third portions 13 and the fourth portions 14 regardless of the fluctuation of the length of the pulse signal for moving the domain walls DW. By stopping the domain walls DW at the boundary portions between the third portions 13 and the fourth portions 14, the positions of the domain walls DW can be controlled with higher precision. By improving the controllability of the positions of the domain walls DW, operation errors such as the unintended reading and writing of magnetization information to the magnetic domains MD and the unintended reading of the magnetization information of the magnetic domains MD do not occur easily. According to the embodiment, the operations of the magnetic memory 100 can be stabilized.

After the read portion 30 reads the orientation of the magnetization of the magnetic domain MD positioned at the first portion 11, the first operation and the second operation are performed; and the read portion 30 again reads the orientation of the magnetization of the magnetic domain MD positioned at the first portion 11. Thus, the magnetization information stored in the first magnetic portion 10 is read by the read portion 30. According to the magnetic memory 100 according to the embodiment, the magnetization information of different magnetic domains MD is read by performing the read operation after performing the first operation and the second operation. In the case where the orientations of the magnetizations of mutually-adjacent magnetic domains MD are different from each other, the signal that is read after performing the first operation and the second operation can be different from the signal read before performing the first operation and the second operation. This is different from a typical magnetic memory. This is because the domain walls move along the flow of the electrons in a typical magnetic memory.

In the magnetic memory according to the embodiment, it is possible for the electrical resistance value between the first portion 11 and the second magnetic portion 32 after performing the first operation and the second operation to be different from the electrical resistance value between the first portion 11 and the second magnetic portion 32 before performing the first operation and the second operation. Or, in the magnetic memory according to the embodiment, when a current is caused to flow between the first portion 11 and the second magnetic portion 32, it is possible for the voltage value between the first portion 11 and the second magnetic portion 32 after performing the first operation and the second operation to be different from the voltage value between the first portion 11 and the second magnetic portion 32 before performing the first operation and the second operation. Or, in the magnetic memory according to the embodiment, when the current is caused to flow between the first portion 11 and the second magnetic portion 32, it is possible for the current value flowing between the first portion 11 and the second magnetic portion 32 after performing the first operation and the second operation to be different from the current value flowing between the first portion 11 and the second magnetic portion 32 before performing the first operation and the second operation.

This is similar for the write operation as well. After the orientation of the magnetization of the second portion 12 is controlled by the write portion 40, the first operation and the second operation are performed; and the write portion 40 again controls the orientation of the magnetization of the second portion 12. Thus, the magnetization information is written to the first magnetic portion 10 by the write portion 40. According to the magnetic memory 100 according to the embodiment, by performing the write operation after the first operation and the second operation are performed, a magnetic domain MD that has a magnetization orientation that is different from that of the magnetic domain MD formed by the previous write operation can be formed in the second portion 12.

One of the multiple magnetic domains MD included in the first magnetic portion 10 corresponds to one bit data. The length in the X-direction of the one magnetic domain MD is, for example, not less than 6 nm and not more than 200 nm. Hereinbelow, the length in the X-direction of one magnetic domain corresponding to one bit is called the bit length.

The length in the X-direction of the first magnetic portion 10 can be modified appropriately according to the desired bit count. The memory capacity of the magnetic memory 100 is small in the case where the length in the X-direction of the first magnetic portion 10 is short. The electrical resistance of the first magnetic portion 10 is high in the case where the length in the X-direction of the first magnetic portion 10 is long. Accordingly, it is desirable for the length in the X-direction of the first magnetic portion 10 to be not less than 100 nm and not more than 10 µm.

The domain wall DW has a finite width determined by an anisotropic energy Ku, an exchange stiffness A, etc., of the magnetic body. The width w of the domain wall DW is represented by $w=(A/Ku)^{1/2}$. For example, the width w is about 3 nm in the case where A=1 (µerg/cm) and Ku=$10^7$ (erg/cm$^3$).

It is desirable for the bit length to be not less than 2 times the width of the domain wall DW. More desirably, the bit length is 15 nm or more. By setting the bit length to be 15 nm or more, the thermal instability due to interactions between adjacent domain walls DW can be suppressed.

To increase the density of the domain walls DW, it is desirable for the orientation of the magnetization of the first magnetic portion 10 to be aligned with a direction (e.g., the Z-direction) crossing the X-direction. The case where the orientation of the magnetization is aligned with the Z-direction is desirable compared to the case where the orientation of the magnetization is aligned with the X-direction because the magnetic anisotropy of the first magnetic portion 10 is large because the demagnetizing field is large.

To increase the magnetic anisotropy of the first magnetic portion 10, it is desirable for the first magnetic portion 10 to include a material having a large uniaxial magnetic anisotropy. A material that has a large uniaxial magnetic anisotropy is, for example, an alloy of at least one element selected from the group consisting of iron (Fe), cobalt (Co), nickel (Ni), manganese (Mn), and chrome (Cr) and at least one element selected from the group consisting of platinum (Pt), palladium (Pd), iridium (Ir), ruthenium (Ru), and rhodium (Rh). The magnitude of the uniaxial magnetic anisotropy also can be adjusted by controlling the composition of the magnetic material included in the first magnetic portion 10, the crystalline order due to the heat treatment, etc.

Also, a magnetic material that has a hcp structure (hexagonal close-packed structure) crystal structure may be used as the magnetic material. Such a magnetic material is, for example, a metal having cobalt (Co) as a major component. Or, another magnetic metal that has a hcp structure may be used.

For example, the first magnetic portion 10 is provided to extend in a direction perpendicular to the substrate surface. In such a case, it is desirable for the first magnetic portion 10 to include a magnetic material such as Co, CoPt, CoCrPt, etc., to cause the orientation of the magnetization of the first magnetic portion 10 to be oriented parallel to the substrate surface. CoPt and CoCrPt may be alloys. These magnetic materials are metal crystals in which the c-axis of the hcp structure is in the film plane.

The first magnetic portion 10 may be provided to extend parallel to the substrate surface. In such a case, the first magnetic portion 10 includes Co, CoPt, or FePt in which the c-axis of the hcp structure is oriented in the film plane perpendicular direction. Or, the first magnetic portion 10 may include TbFe, a stacked film of Co and Ni, etc. CoPt may be an alloy. In the case of TbFe, TbFe has a perpendicular anisotropy when Tb is not less than 20 atomic % and not more than 40 atomic %. These materials are favorable because the orientation of the magnetization of the first magnetic portion 10 is oriented perpendicularly to the substrate surface.

Also, a material that is an alloy of a rare-earth element and an iron group transition element and has a magnetic anisotropy perpendicular to the wire direction can be used as the magnetic material of the first magnetic portion 10. Specifically, GdFe, GdCo, GdFeCo, TbFe, TbCo, TbFeCo, GdTbFe, GdTbCo, DyFe, DyCo, DyFeCo, etc., can be used.

Various properties such as the magnetic properties, the crystallinity, the mechanical properties, the chemical properties, etc., of the magnetic material included in the first magnetic portion 10 may be adjusted by adding a nonmagnetic element such as Ag, Cu, Au, Al, Mg, Si, Bi, Ta, B, C, O, N, Pd, Pt, Zr, Ir, W, Mo, Nb, H, etc.

The first nonmagnetic portion 31 and the second nonmagnetic portion 41 may include a nonmagnetic metal material or a nonmagnetic insulating material. Au, Cu, Cr, Zn, Ga, Nb, Mo, Ru, Pd, Ag, Hf, Ta, W, Pt, or Bi may be used as the nonmagnetic metal material. Or, an alloy that includes at least one of these metal materials may be used.

To increase the magnetoresistance effect of the read portion 30 and the write portion 40, it is effective to cause the first nonmagnetic portion 31 and the second nonmagnetic portion 41 to function as tunneling barrier layers. In such a case, the first nonmagnetic portion 31 and the second nonmagnetic portion 41 may include a nonmagnetic semiconductor such as $Al_2O_3$, $SiO_2$, MgO, AlN, $Bi_2O_3$, $MgF_2$, $CaF_2$, $SrTiO_3$, $AlLaO_3$, Al—N—O, Si—N—O, etc. ZnO, InMn, GaN, GaAs, $TiO_2$, Zn, Te, or such a substance doped with a transition metal may be used as the nonmagnetic semiconductor.

It is unnecessary for the compounds described above to have perfectly precise stoichiometric compositions; and a deficiency or excess of oxygen, nitrogen, fluorine, or the like may exist.

It is desirable for the magnetostatic coupling between the first magnetic portion 10 and the second magnetic portion 32 and the magnetostatic coupling between the first magnetic portion 10 and the third magnetic portion 42 to be small. Additionally, it is desirable for the thickness of the first nonmagnetic portion 31 and the thickness of the second nonmagnetic portion 41 to be thicker than the spin diffusion length in the first nonmagnetic portion 31 and the spin diffusion length in the second nonmagnetic portion 41. Therefore, it is desirable for the thickness of the first nonmagnetic portion 31 and the thickness of the second nonmagnetic portion 41 to be, for example, not less than 0.2 nm and not more than 20 nm.

In the case where the first nonmagnetic portion 31 and the second nonmagnetic portion 41 include insulating materials, it is desirable for the thickness of the first nonmagnetic portion 31 and the thickness of the second nonmagnetic portion 41 to be not less than 0.2 nm and not more than 5 nm. In the case where the first nonmagnetic portion 31 and the second nonmagnetic portion 41 are insulating layers, pinholes may exist in the interiors of these layers.

The third electrode 33, the fourth electrode 43, the first electrode 50, and the second electrode 51 may include a metal such as aluminum, copper, etc.

An antiferromagnetic portion may be provided between the second magnetic portion 32 and the third electrode 33 and between the third magnetic portion 42 and the fourth electrode 43. The antiferromagnetic portion may include an antiferromagnetic material such as Fe—Mn, Pt—Mn, Pt—Cr—Mn, Ni—Mn, Pd—Mn, Pd—Pt—Mn, Ir—Mn, Pt—Ir—Mn, NiO, $Fe_2O_3$, a magnetic semiconductor, etc.

The inventors performed simulations for the case where the first magnetic portion 10 includes a 3d transition metal element such as Fe, Co, etc. As a result, the following was discovered. The domain walls DW of the first magnetic portion 10 can be moved toward the second portion 12 by the first operation and the second operation described above in the case where the first metal portion 20 includes at least one of Hf or Ta and the second metal portion 21 includes at least one of W or Pt.

The inventors consider that there is a possibility of a relationship between this phenomenon and a Dzyaloshinskii-Moriya Interaction (DMI). According to this consideration, the domain walls DW of the first magnetic portion 10 can be moved toward the second portion 12 by the first operation and the second operation in the case where the sign of a coefficient D of the DMI of the first metal portion 20 is one of positive or negative and the sign of the coefficient D of the DMI of the second metal portion 21 is the other of positive or negative. In the example illustrated in FIG. 1 and FIG. 2, it is considered that the sign of the coefficient D of the first metal portion 20 is negative; and the sign of the coefficient D of the second metal portion 21 is positive.

In the case of the effects of the coefficient D, the first metal portion 20 may include the following first metal material; and the second metal portion 21 may include the following second metal material. The first metal material is at least one material selected from the group consisting of Au, Ir, Al, Pb, Ta, W, and Hf. The second metal material is at least one material selected from the group consisting of Pt, Pd, and Rh. It is desirable for the first metal material and the second metal material to be nonmagnetic.

Or, the first metal portion 20 and the second metal portion 21 may include at least one material selected from the group consisting of Au, Ir, Al, Pb, Ta, W, and Hf; and only the first metal portion 20 may further include at least one material selected from the group consisting of B, N, Cu, Tb, Ag, Au, Ir, Al, W, Ta, Tb, Hf, Pt, Rh, Pb, and Pd.

Or, the first metal portion 20 and the second metal portion 21 may include at least one material selected from the group consisting of Au, Ir, Al, W, Ta, Hf, Pt, Pd, Pb, and Rh; and only the second metal portion 21 may further include at least one material selected from the group consisting of B, N, Cu, Tb, Ag, Au, Ir, Al, W, Ta, Tb, Hf, Pt, Rh, Pb, and Pd.

Figure 3:
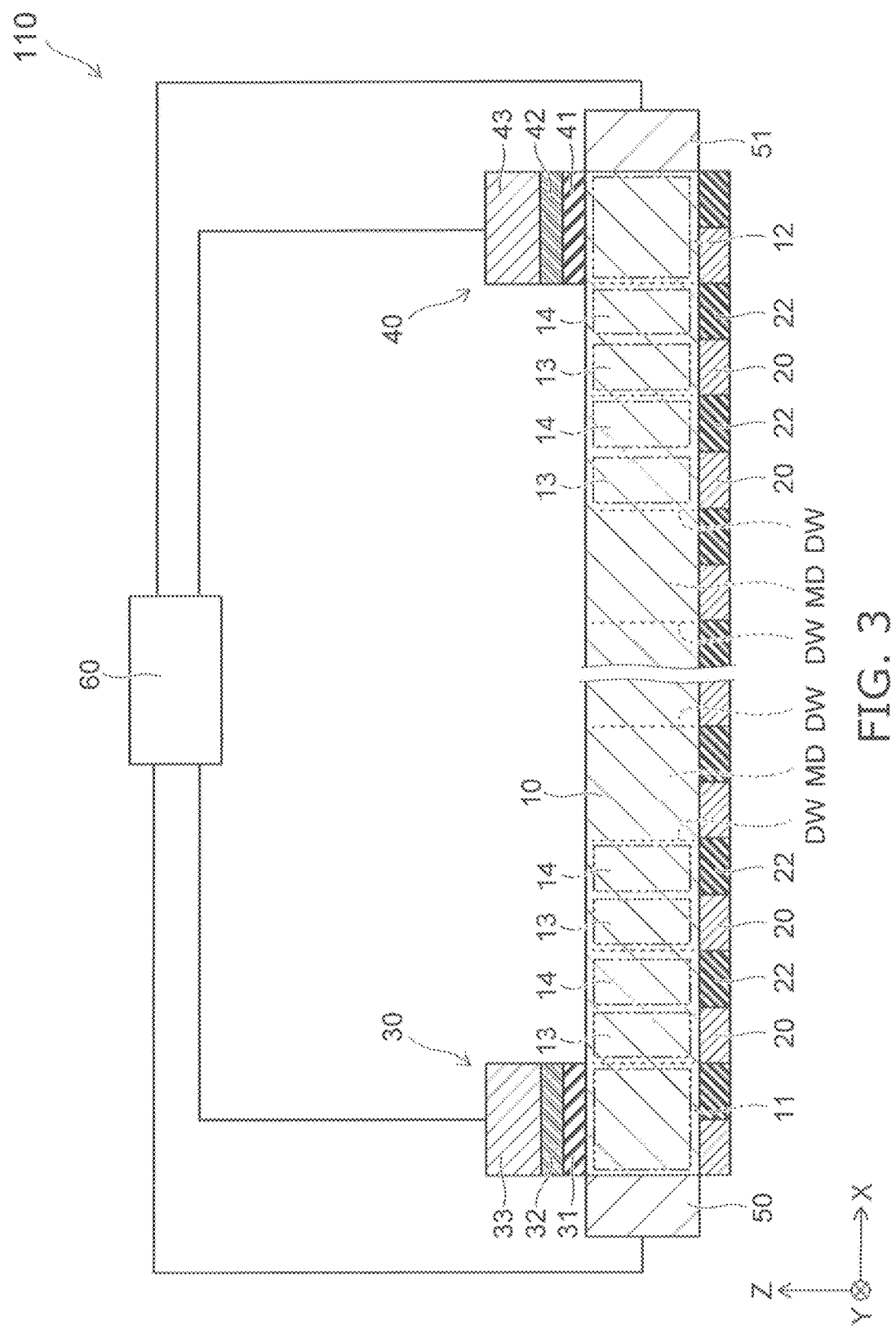
FIG. 3 is a cross-sectional view illustrating an example of a magnetic memory according to a first modification of the first embodiment.

FIG. 3 is a cross-sectional view illustrating an example of a magnetic memory 110 according to a first modification of the first embodiment.

For example, the magnetic memory 110 is different from the magnetic memory 100 in that an insulating portion 22 is provided instead of the second metal portion 21.

The insulating portion 22 is multiply provided in the X-direction. The multiple insulating portions 22 respectively overlap the multiple fourth portions 14 in the Z-direction. The multiple first metal portions 20 and the multiple insulating portions 22 are provided alternately in the X-direction.

In the magnetic memory 110 according to the modification as well, similarly to the magnetic memory 100, the controller 60 can move the domain walls DW by performing the first operation and the second operation. Specifically, the domain walls DW of the third portions 13 are moved from the first portion 11 toward the second portion 12 by the first operation of the controller 60. The domain walls DW of the fourth portions 14 are moved from the first portion 11 toward the second portion 12 by the second operation of the controller 60. Therefore, according to the modification, the operations of the magnetic memory 110 can be stabilized.

Figure 4:
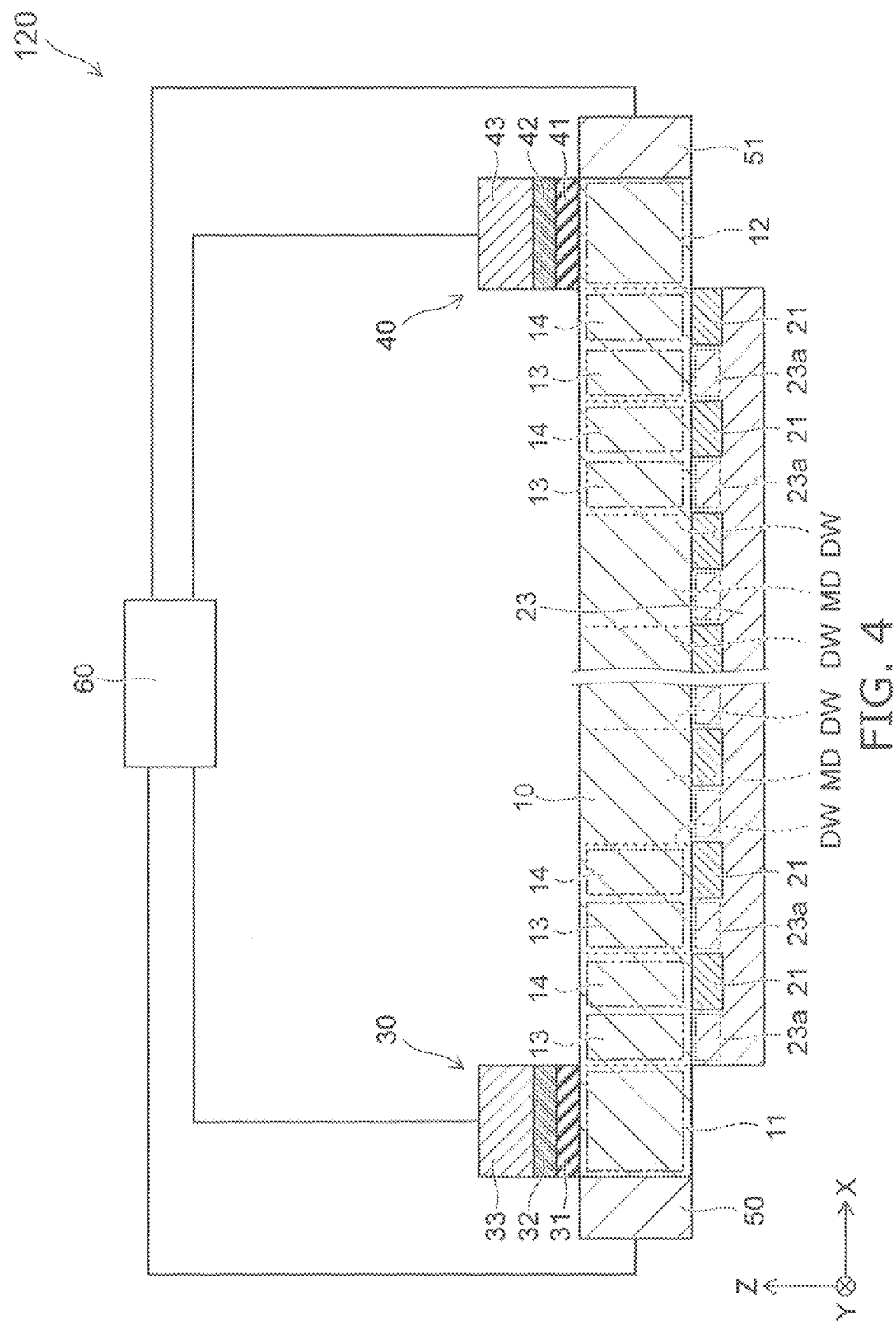
FIG. 4 is a cross-sectional view illustrating an example of a magnetic memory according to a second modification of the first embodiment.

FIG. 4 is a cross-sectional view illustrating an example of a magnetic memory 120 according to a second modification of the first embodiment.

The magnetic memory 120 is different from the magnetic memory 100 in that a metal layer 23 is provided instead of the multiple first metal portions 20.

For example, the multiple second metal portions 21 are provided between the first magnetic portion 10 and the metal layer 23 in the Z-direction. The metal layer 23 includes multiple metal portions 23a. The multiple metal portions 23a respectively overlap the multiple third portions 13 in the Z-direction. The multiple second metal portions 21 and the multiple metal portions 23a are provided alternately in the X-direction. The metal layer 23 includes a metal material similar to that of the second metal portion 21.

According to the magnetic memory 120 according to the modification as well, effects similar to those of the magnetic memory 100 can be obtained.

The modification is not limited to the example illustrated in FIG. 4. The metal layer 23 may not be provided instead of the multiple first metal portions 20; and a metal layer may be provided instead of the multiple second metal portions 21. In the magnetic memory 110, also, an insulating layer may be provided instead of the multiple insulating portions 22 as in the modification.

In the first embodiment described above, in the magnetic memory 100 illustrated in FIG. 1, the multiple first metal portions 20 and the multiple second metal portions 21 are provided on the same side of the first magnetic portion 10. However, the multiple first metal portions 20 and the multiple second metal portions 21 may be provided on mutually-opposite sides of the first magnetic portion 10. The position in the Z-direction of the first magnetic portion 10 may be between the position in the Z-direction of the first metal portion 20 and the position in the Z-direction of the second metal portion 21.

Or, a portion of the multiple first metal portions 20 may be provided on one side of the first magnetic portion 10 in the Z-direction; and another portion of the multiple first metal portions 20 may be provided on the other side of the first magnetic portion 10 in the Z-direction. Or, a portion of the multiple first metal portions 20 may respectively overlap a portion of the multiple third portions 13 in the Z-direction; and another portion of the multiple first metal portions 20 may respectively overlap another portion of the multiple third portions 13 in the Y-direction. This is similar for the multiple second metal portions 21 as well.

The magnetic memory 110 illustrated in FIG. 3 also is similar. The multiple first metal portions 20 and the multiple insulating portions 22 may be provided on mutually-opposite sides of the first magnetic portion 10. A portion of the multiple insulating portions 22 may be provided on one side of the first magnetic portion 10 in the Z-direction; and another portion of the multiple insulating portions 22 may be provided on the other side of the first magnetic portion 10 in the Z-direction.

Figure 5:
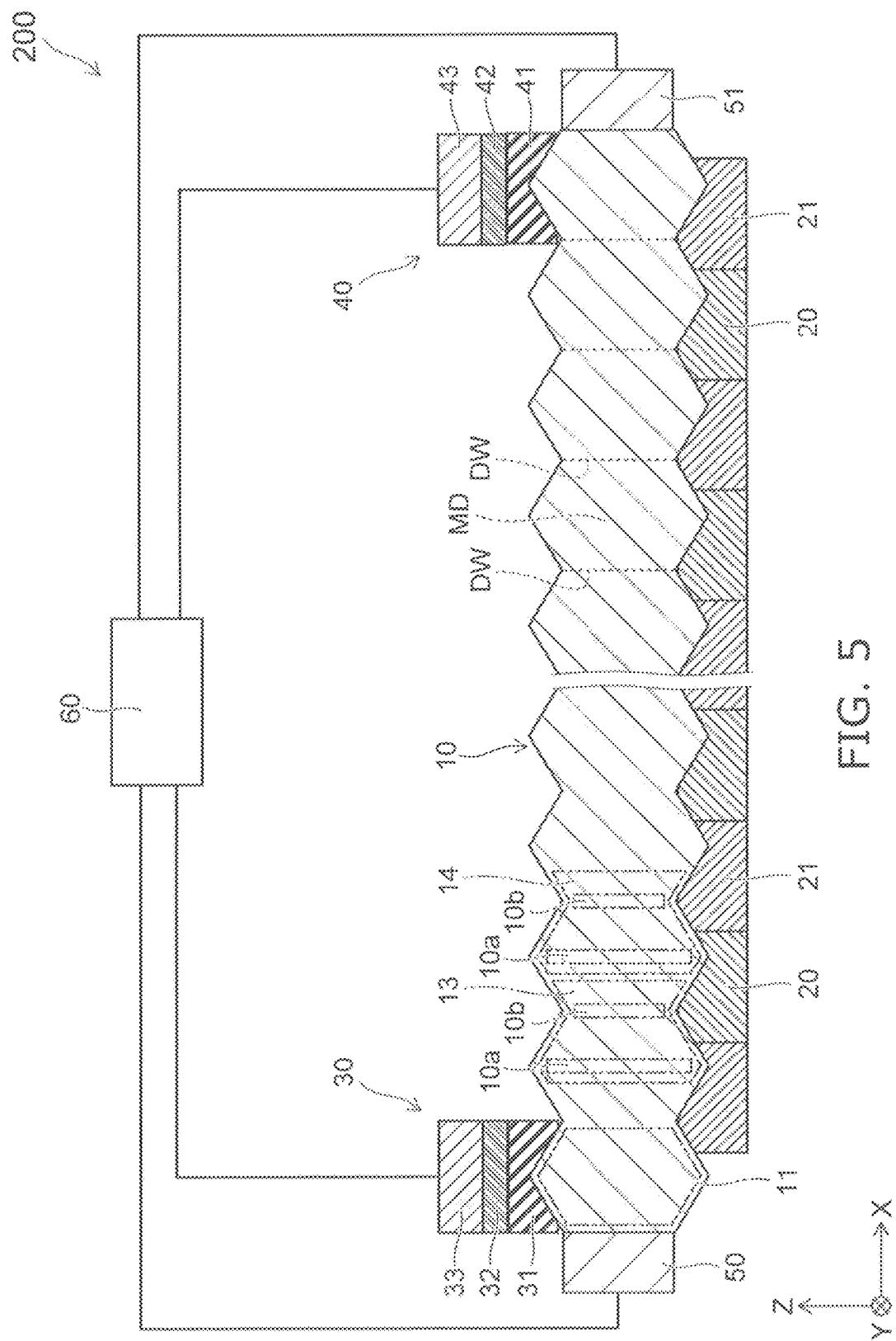
FIG. 5 is a cross-sectional view illustrating an example of a magnetic memory according to a second embodiment.

FIG. 5 is a cross-sectional view illustrating an example of a magnetic memory 200 according to a second embodiment.

Figure 6:
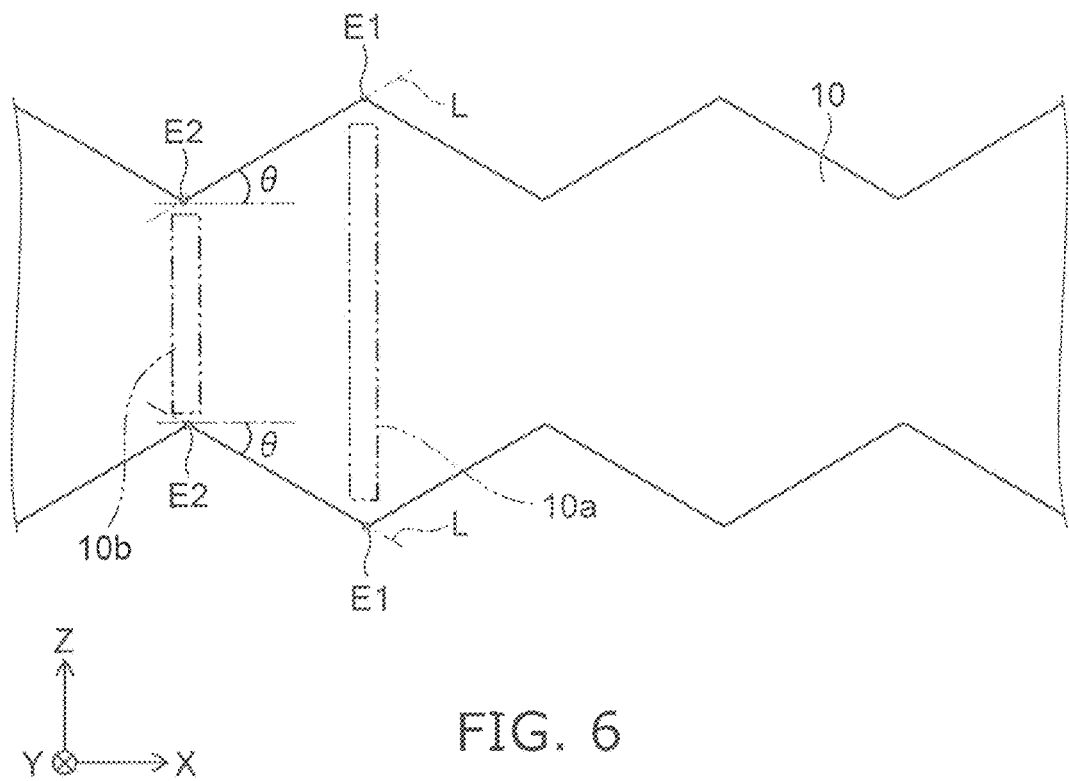
FIG. 6 is a cross-sectional view in which the first magnetic portion of the magnetic memory according to the second embodiment is enlarged.

FIG. 6 is a cross-sectional view in which the first magnetic portion 10 of the magnetic memory 200 according to the second embodiment is enlarged.

Figure 7A:
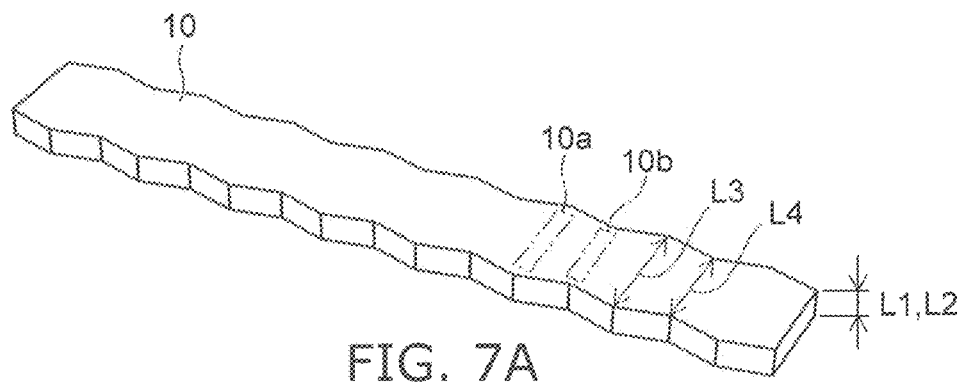
FIG. 7A to FIG. 7C are perspective views illustrating examples of the first magnetic portion of the magnetic memory according to the second embodiment.
Figure 7B:
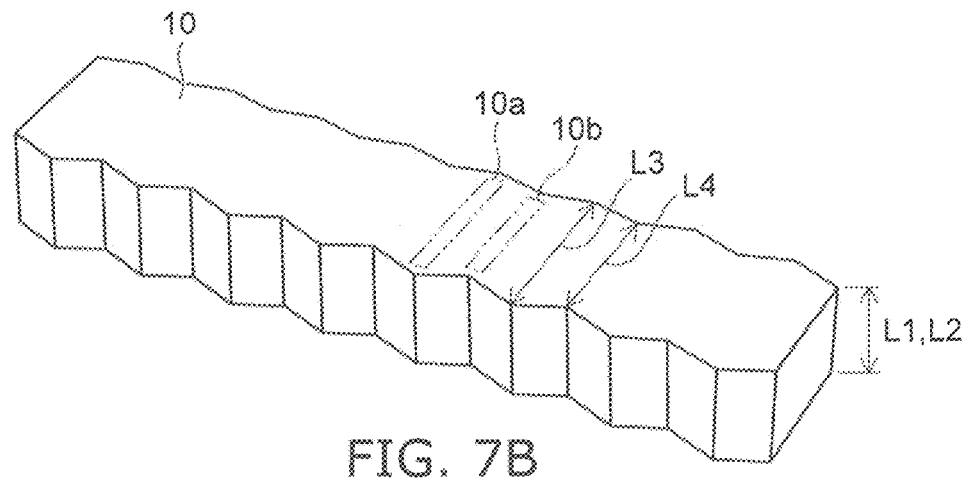
Figure 7C:
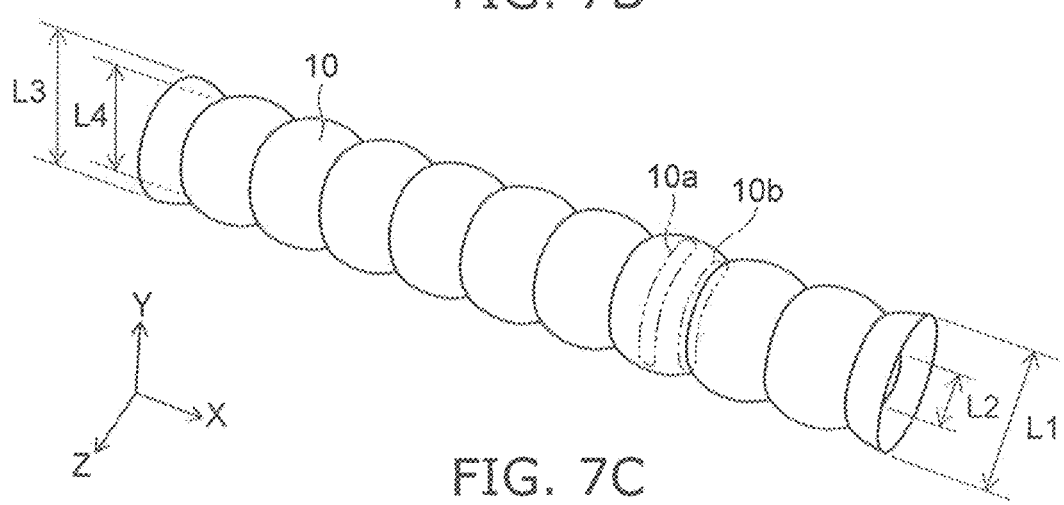

FIG. 7A to FIG. 7C are perspective views illustrating examples of the first magnetic portion 10 of the magnetic memory 200 according to the second embodiment.

For example, the configuration of the first magnetic portion 10 of the magnetic memory 200 is different from that of the magnetic memory 100.

In the magnetic memory 200 as illustrated in FIG. 5, the first magnetic portion 10 includes multiple first regions 10a and multiple second regions 10b. The length in the Z-direction of the first region 10a is longer than the length in the Z-direction of the second region 10b. The length in the Y-direction of the first region 10a may be longer than the length in the Y-direction of the second region 10b.

The multiple first regions 10a and the multiple second regions 10b are provided alternately in the X-direction. Each of the third portions 13 includes one first region 10a and one second region 10b. Each of the fourth portions 14 includes one first region 10a and one second region 10b.

Each of the first metal portions 20 overlaps one first region 10a and one second region 10b in the Z-direction. Each of the second metal portions 21 overlaps one first region 10a and one second region 10b in the Z-direction. The position in the X-direction of the boundary between the first metal portion 20 and the second metal portion 21 is between the position in the X-direction of the first region 10a and the position in the X-direction of the second region 10b.

The magnetostatic energy when the domain wall DW exists at the second region 10b is smaller than the magnetostatic energy when the domain wall DW exists at the first region 10a. Therefore, when the domain wall DW exists somewhere other than the second region 10b, the domain wall DW may move to the second region 10b even when there is no current.

To cause the domain wall DW to move easily to the second region 10b, it is desirable for a tilt θ of a line segment L with respect to the X-direction to be not less than 4 degrees and not more than 30 degrees as illustrated in FIG. 6. The line segment L connects an outer edge E1 of the first region 10a and an outer edge E2 of the second region 10b.

As illustrated in FIG. 7A to FIG. 7C, the first magnetic portion 10 that includes the multiple first regions 10a and the multiple second regions 10b may have various configurations.

In the example illustrated in FIG. 7A, a length L1 in the Y-direction of the first region 10a is the same as a length L2 in the Y-direction of the second region 10b. The length L1 is shorter than a length L3 in the Z-direction of the first region 10a and shorter than a length L4 in the Z-direction of the second region 10b. The length L2 is shorter than the length L3 and shorter than the length L4.

In the example illustrated in FIG. 7B, the length L1 is substantially the same as the length L4; and the length L2 is substantially the same as the length L4. The length L1 may be substantially the same as the length L3; and the length L2 may be substantially the same as the length L3. Or, the length L1 may be longer than the length L4; and the length L2 may be longer than the length L4.

In the example illustrated in FIG. 7C, the length L1 is longer than the length L2; and the length L3 is longer than the length L4. For example, the length L1 is the same as the length L3; and the length L2 is the same as the length L4.

FIG. 8A to FIG. 8C, FIG. 9A, and FIG. 9B are cross-sectional views illustrating an example of an operation of the magnetic memory 200 according to the second embodiment.

Figure 10:
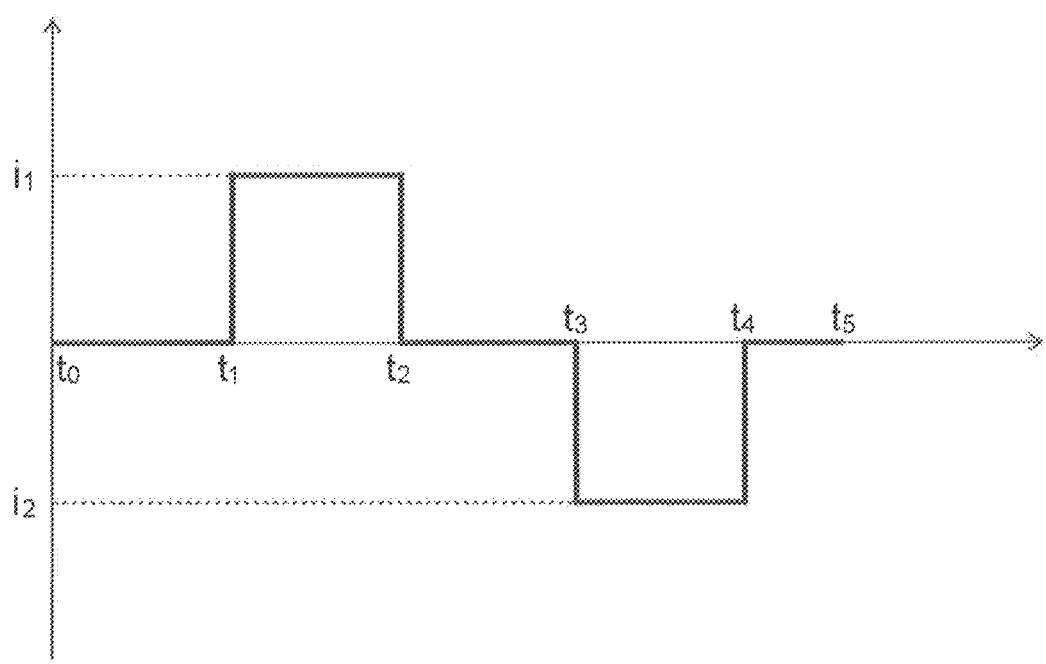
FIG. 10 is a graph illustrating an example of the relationship between the time and the orientation of the current supplied to the first magnetic portion.

FIG. 10 is a graph illustrating an example of the relationship between the time and the orientation of the current supplied to the first magnetic portion 10.

In FIG. 10, the horizontal axis is the time; and the vertical axis is the current value. In FIG. 10, the current that flows from the first electrode 50 to the second electrode 51 is taken to be positive; and the current that flows from the second electrode 51 to the first electrode 50 is taken to be negative.

Figure 8A:
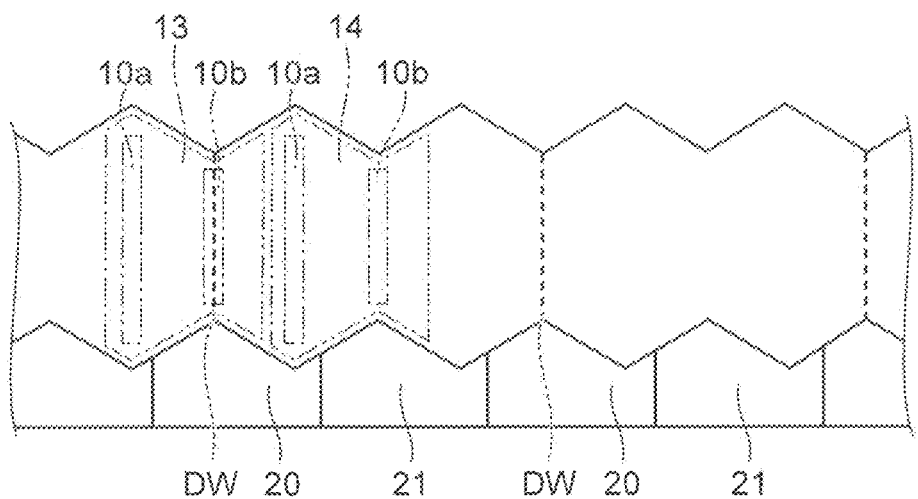
FIG. 8A to FIG. 8C, FIG. 9A, and FIG. 9B are cross-sectional views illustrating an example of an operation of the magnetic memory according to the second embodiment.

FIG. 8A illustrates a state between a time $t_0$ and a time $t_1$ illustrated in FIG. 10. The domain walls DW exist at the second regions 10b when a current is not supplied to the first magnetic portion 10.

Figure 8B:
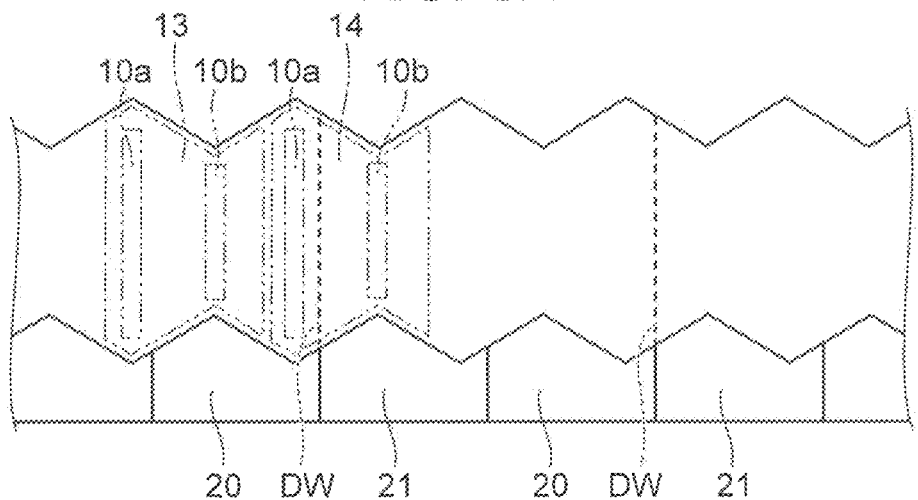

The first operation is performed by the controller 60 between the time $t_1$ and a time $t_2$. FIG. 8B illustrates the state of the time $t_2$ illustrated in FIG. 10. In the first operation, for example, the first current is supplied to the first magnetic portion 10 toward the right direction of the drawing. When the first operation is performed, the domain walls DW of the third portions 13 move along the flow of the current. The domain walls DW of the third portions 13 move toward the second portion 12 to the boundary portions between the third portions 13 and the fourth portions 14.

Figure 8C:
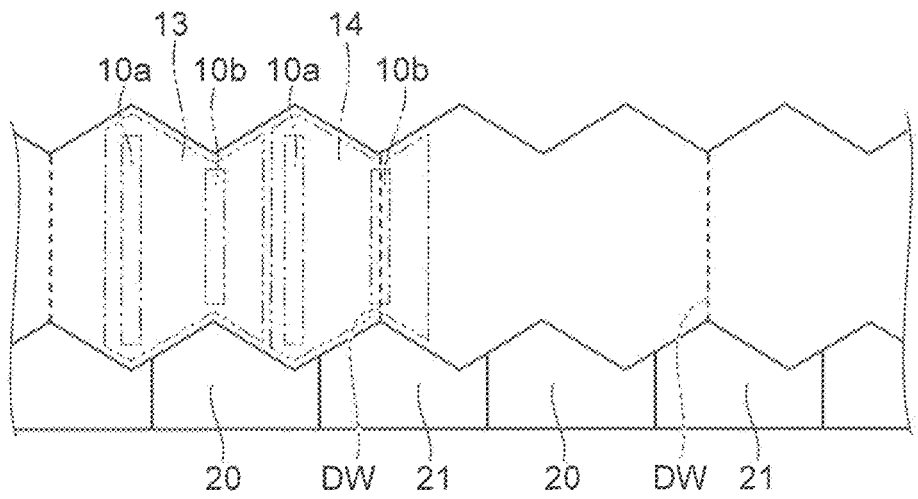

A third operation is performed by the controller 60 between the time $t_2$ and a time $t_3$. In other words, the controller 60 performs the third operation during the first operation and the second operation. In the third operation, the controller 60 stops the first current supplied between the first electrode 50 and the second electrode 51. FIG. 8C illustrates the state of the time $t_3$ illustrated in FIG. 10. Between the time $t_2$ and the time $t_3$, the domain walls DW that exist at the boundaries between the third portions 13 and the fourth portions 14 move to the energetically stable second regions 10b in the state in which the current is not supplied.

Figure 9A:
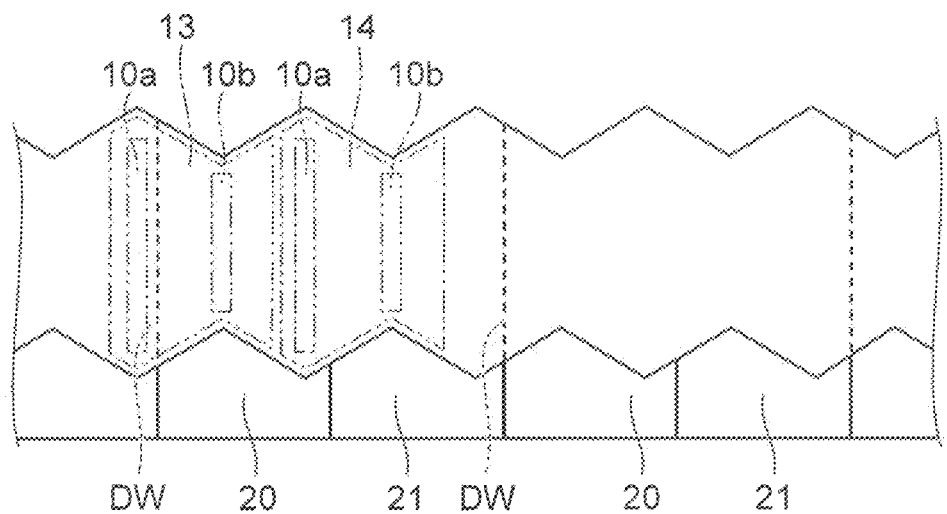

The second operation is performed by the controller 60 between the time $t_3$ and a time $t_4$. FIG. 9A illustrates the state of the time $t_4$ illustrated in FIG. 10. In the second operation, the second current is supplied toward the left direction of the drawing. When the second operation is performed, the domain walls DW of the fourth portions 14 move in reverse with respect to the flow of the current. The domain walls DW of the fourth portions 14 move toward the second portion 12 to the boundary portions between the third portions 13 and the fourth portions 14.

Figure 9B:
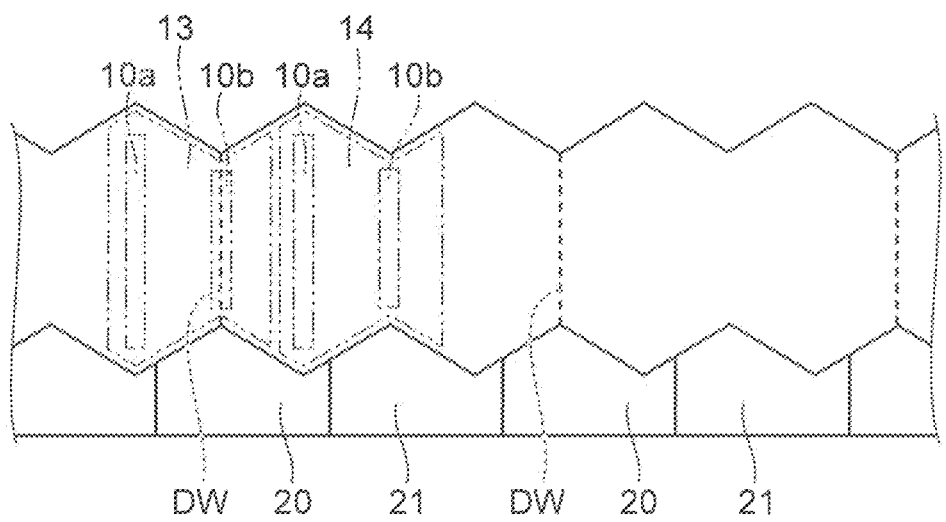

The third operation is performed by the controller 60 between the time $t_4$ and a time $t_5$. FIG. 9B illustrates the state of the time $t_5$ illustrated in FIG. 10. Between the time $t_4$ and the time $t_5$, the domain walls DW that exist at the boundaries between the third portions 13 and the fourth portions 14 move to the energetically stable second regions 10b in the state in which the current is not supplied.

In the third operation, the controller 60 may cause a current to flow toward the first portion 11 or the second portion 12. In the third operation, the absolute value of the current value of the third current is set to be less than the absolute value of the first current value $i_1$ of the first operation and less than the absolute value of the second current value $i_2$ of the second operation. More specifically, the absolute value of the current value of the third current is set in a range in which the domain walls DW are movable to the second regions 10b from the boundaries between the third portions 13 and the fourth portions 14.

If the current is caused to flow in the state in which the domain walls DW are between the third portions 13 and the fourth portions 14, there is a possibility that the orientation of the movement of the domain walls DW may not be stable. In the magnetic memory 200 according to the embodiment, after the domain walls DW are caused to move by the current, the domain walls DW move to the fourth portions 14 from the boundaries between the third portions 13 and the fourth portions 14. Therefore, the orientation of the movement of the domain walls DW can be stable when the current is caused to flow in the first magnetic portion 10.

In the examples described above, positions where the domain walls DW are energetically stable are formed by providing the first regions 10a and the second regions 10b that have different lengths in the Z-direction. However, the embodiment is not limited to these examples. For example, an element other than the magnetic material may be added to a portion of the third portions 13 and a portion of the fourth portions 14; and positions where the domain walls DW are energetically stable may be formed by adjusting the magnetic properties. Or, positions where the domain walls DW are energetically stable may be formed by applying an electric field to a portion of the third portions 13 and a portion of the fourth portions 14.

Figure 11:
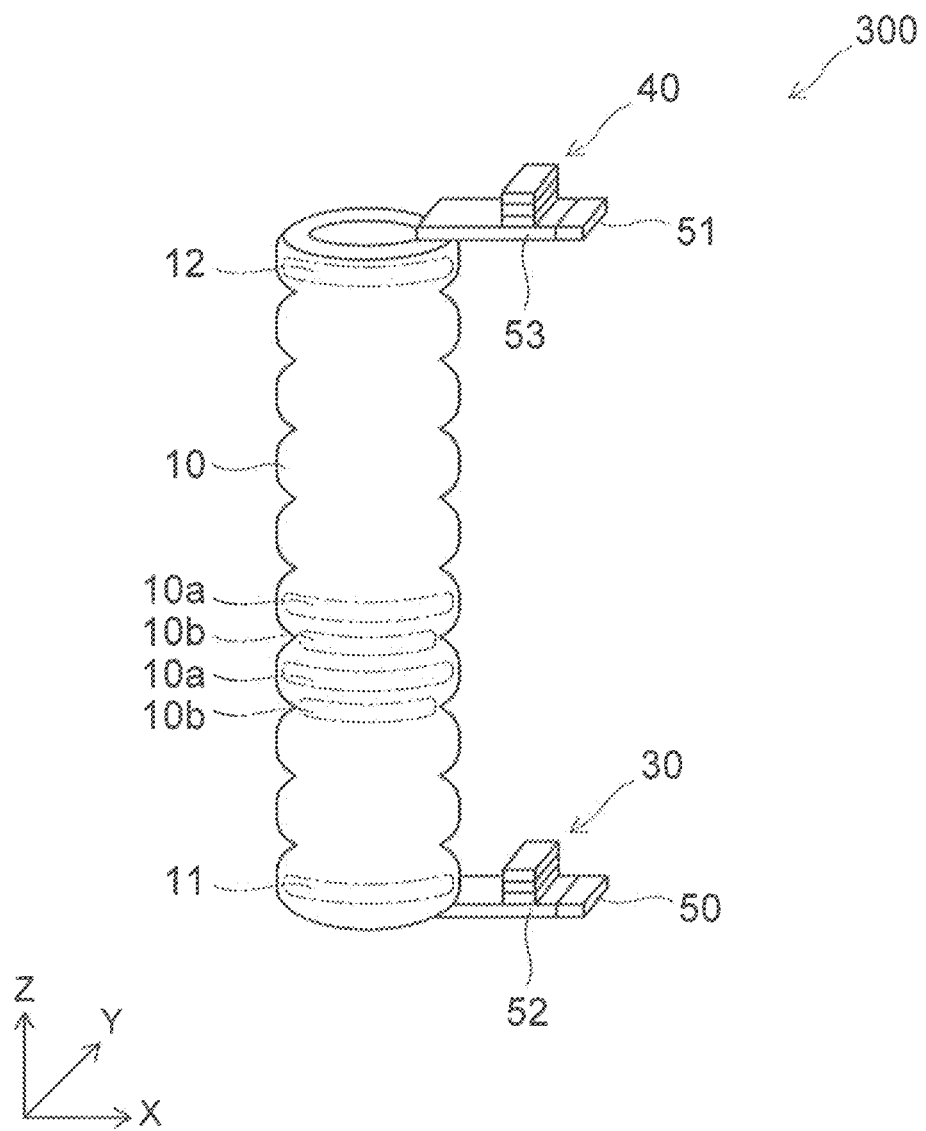
FIG. 11 is a perspective view illustrating an example of a portion of a magnetic memory according to a third embodiment.

FIG. 11 is a perspective view illustrating an example of a portion of a magnetic memory 300 according to a third embodiment.

Figure 12:
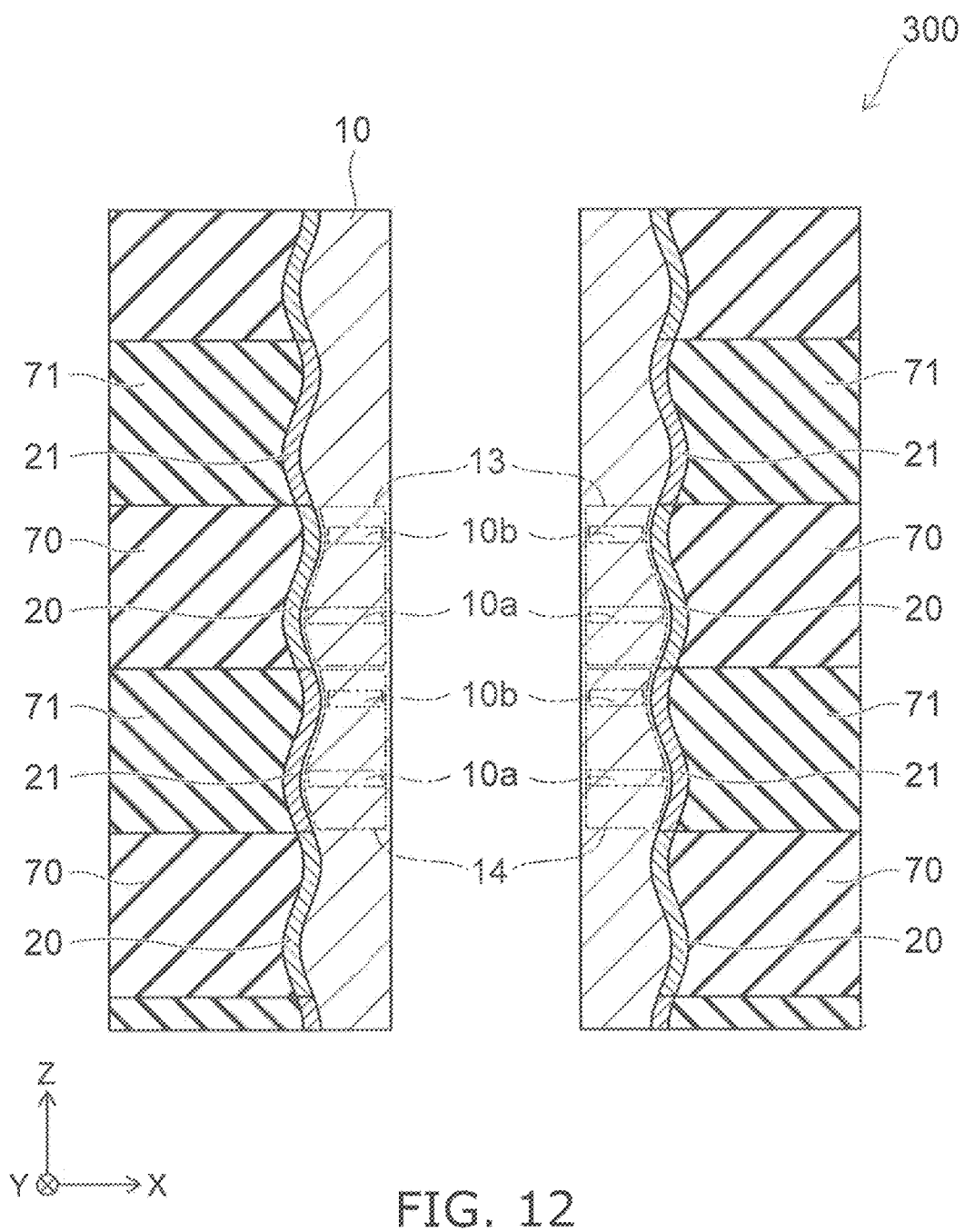
FIG. 12 is a cross-sectional view illustrating an example of a portion of the magnetic memory according to the third embodiment.

FIG. 12 is a cross-sectional view illustrating an example of a portion of the magnetic memory 300 according to the third embodiment.

As illustrated in FIG. 11 and FIG. 12, the magnetic memory 300 includes the first magnetic portion 10, the first metal portion 20, the second metal portion 21, the read portion 30, the write portion 40, the first electrode 50, the second electrode 51, a magnetic portion 52, a magnetic portion 53, the controller 60, an insulating layer 70, and an insulating layer 71.

For example, the first magnetic portion 10 extends in a direction perpendicular to the surface of a substrate in which the magnetic memory 300 is formed. The first magnetic portion 10 has a tubular configuration. Similarly to the magnetic memory 200 according to the second embodiment, the first magnetic portion 10 includes the first portion 11, the second portion 12, the multiple third portions 13, the multiple fourth portions 14, the multiple first regions 10a, and the multiple second regions 10b.

For example, one end of the magnetic portion 52 is connected to the first portion 11. The first electrode 50 is electrically connected to the other end of the magnetic portion 52. The read portion 30 is connected to the magnetic portion 52. For example, the read portion 30 is connected to the magnetic portion 52 on a current path between the first electrode 50 and the first portion 11.

For example, one end of the magnetic portion 53 is connected to the second portion 12. The second electrode 51 is electrically connected to the other end of the magnetic portion 53. The write portion 40 is connected to the magnetic portion 53. For example, the write portion 40 is connected to the magnetic portion 53 on a current path between the second electrode 51 and the second portion 12.

The first magnetic portion 10, the magnetic portion 52, and the magnetic portion 53 are provided so that the magnetic domains can be moved between the first magnetic portion 10 and the magnetic portion 52 and between the first magnetic portion 10 and the magnetic portion 53.

For example, the thickness of the first region 10a is the same as the thickness of the second region 10b. The outer diameter of the first region 10a is larger than the outer diameter of the second region 10b. Therefore, the length in the X-direction and the length in the Y-direction of the first region 10a are longer than the length in the X-direction and the length in the Y-direction of the second region 10b.

The insulating layer 70 is multiply provided in the Z-direction. The insulating layer 71 is multiply provided in the Z-direction. The multiple insulating layers 70 and the multiple insulating layers 71 are provided alternately in the Z-direction.

The multiple first metal portions 20 are provided respectively around the multiple third portions 13 along the X-direction and the Y-direction. The multiple insulating layers 70 are provided respectively around the multiple first metal portions 20 along the X-direction and the Y-direction. Each of the insulating layers 70 is provided around one first region 10a and one second region 10b along the X-direction and the Y-direction.

The multiple second metal portions 21 are provided respectively around the multiple fourth portions 14 along the X-direction and the Y-direction. The multiple insulating layers 71 are provided respectively around the multiple second metal portions 21 along the X-direction and the Y-direction. Each of the insulating layers 71 is provided around one first region 10a and one second region 10b along the X-direction and the Y-direction.

The insulating layer 70 and the insulating layer 71 include insulating materials such as $SiO_2$, etc. The insulating layer 70 further includes a material that is different from that of the insulating layer 71. For example, the insulating layer 70 includes Pd; and the insulating layer 71 does not include Pd.

For example, the first metal portion 20 includes Pd; and the second metal portion 21 does not include Pd. Or, the insulating layer 70 and the insulating layer 71 may include Pd; and the concentration of Pd in the insulating layer 70 may be higher than the concentration of Pd in the insulating layer 71.

The first metal portion 20 and the second metal portion 21 may include Pd; and the concentration of Pd in the first metal portion 20 may be higher than the concentration of Pd in the second metal portion 21.

The operations of the magnetic memory 300 are similar to the operations of the magnetic memory 200. The domain walls DW of the second regions 10b of the third portions 13 are moved to the boundaries between the third portions 13 and the fourth portions 14 by the first operation of the controller 60.

The domain walls DW move to the energetically stable second regions 10b of the fourth portions 14. The domain walls DW of the second regions 10b of the fourth portions 14 are moved to the boundaries between the third portions 13 and the fourth portions 14 by the second operation of the controller 60. The domain walls DW move to the energetically stable second regions 10b of the third portions 13.

In the embodiment as well, similarly to the second embodiment, the operations of the magnetic memory 300 can be stabilized further.

FIG. 13A to FIG. 13D are cross-sectional views illustrating an example of a method for manufacturing the magnetic memory 300 according to the third embodiment. The method for forming the first magnetic portion 10, the first metal portion 20, the second metal portion 21, the insulating layer 70, and the insulating layer 71 will now be described. The formation of the first electrode 50, the second electrode 51, the magnetic portion 52, the magnetic portion 53, the read portion 30, and the write portion 40 may be appropriately selected from known technology.

As illustrated in FIG. 13A, a stacked body SB is formed by alternately forming the multiple insulating layers 70 and the multiple insulating layers 71 on a not-illustrated substrate. The insulating layers 70 and the insulating layers 71 are formed using $SiO_2$ as the insulating material; and Pd is added only when forming the insulating layers 70.

As illustrated in FIG. 13B, an opening OP1 is formed in the stacked body SB. The opening OP1 is formed so that a portion having a large diameter and a portion having a small diameter are arranged alternately in the Z-direction. The opening OP1 includes one portion having a large diameter and one portion having a small diameter at each of the insulating layers 70. The opening OP1 includes one portion having a large diameter and one portion having a small diameter at each of the insulating layers 71.

As illustrated in FIG. 13C, a metal layer 20a is formed on the inner wall of the opening OP1. The metal layer 20a includes at least one nonmagnetic metal material selected from the group consisting of Au, Ir, Al, Pb, Ta, W, and Hf. The metal layer 20a has a substantially uniform thickness at each portion of the opening OP1.

By performing heat treatment, the Pd is diffused from the multiple insulating layers 70 into the metal layer 20a. As a result, multiple portions that include Pd and are separated from each other in the Z-direction are formed in the metal layer 20a. The portions where the Pd is diffused correspond to the first metal portions 20 illustrated in FIG. 12.

The opening OP1 is filled by forming a magnetic portion in the opening OP1 interior. As illustrated in FIG. 13D, an opening OP2 is formed in the magnetic portion; and the first magnetic portion 10 that has a tubular configuration is formed. An insulating layer may be formed further in the opening OP2 interior.

Figure 14:
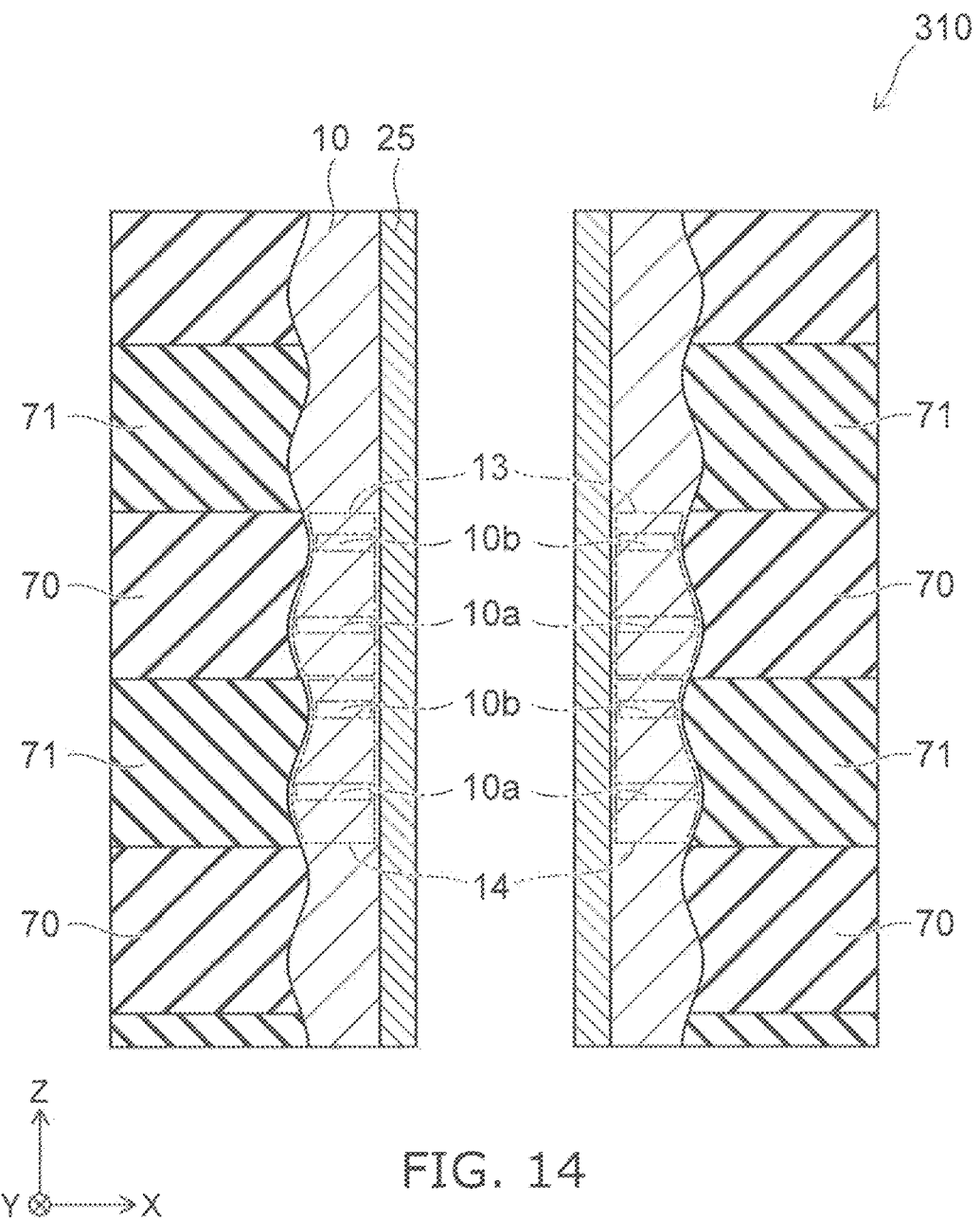
FIG. 14 is a cross-sectional view illustrating an example of a magnetic memory according to a first modification of the third embodiment.

FIG. 14 is a cross-sectional view illustrating an example of a magnetic memory 310 according to a first modification of the third embodiment.

In the magnetic memory 310, the first magnetic portion 10 is provided around a metal layer 25 along the X-direction and the Y-direction. The first magnetic portion 10 and the metal layer 25 have tubular configurations.

Similarly to the magnetic memory 300, the insulating layer 70 is provided around one first region 10a and one second region 10b along the X-direction and the Y-direction. The insulating layer 71 is provided around one first region 10a and one second region 10b along the X-direction and the Y-direction.

In the case where interactions exist between the first magnetic portion 10 and the insulating layer 70 and between the first magnetic portion 10 and the insulating layer 71, similarly to the magnetic memory 300, the domain walls DW can be moved in one direction by the controller 60 performing the first operation and the second operation alternately.

Figure 15:
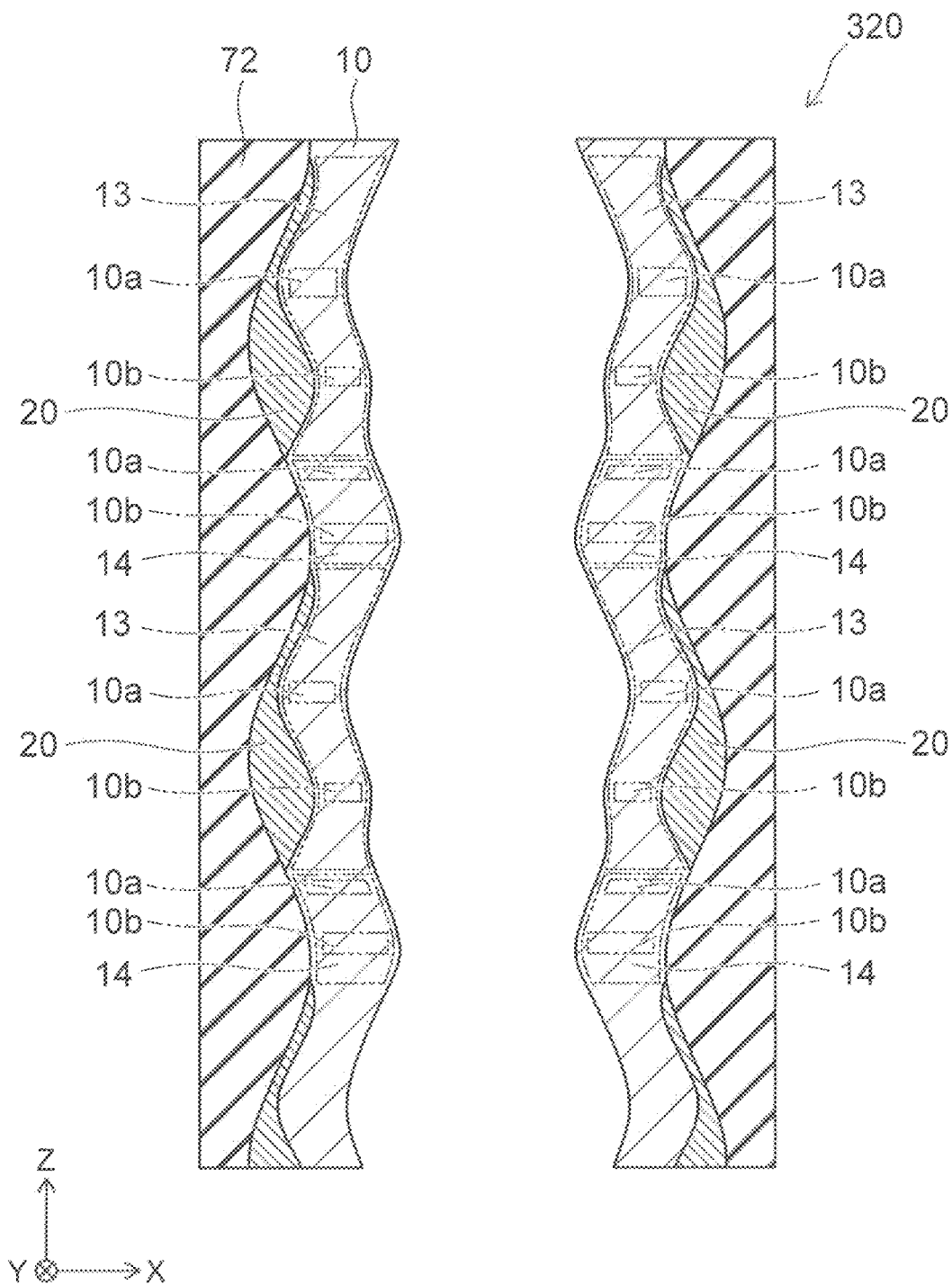
FIG. 15 is a cross-sectional view illustrating an example of a portion of a magnetic memory 320 according to a second modification of the third embodiment.

FIG. 15 is a cross-sectional view illustrating an example of a portion of a magnetic memory 320 according to a second modification of the third embodiment.

In the magnetic memory 320, the multiple first metal portions 20 are provided respectively around the multiple third portions 13 along the X-direction and the Y-direction. An insulating layer 72 is provided around the multiple first metal portions 20 and the multiple fourth portions 14 along the X-direction and the Y-direction. In other words, the first metal portions 20 are provided only between the insulating layer 72 and the third portions 13; and the first metal portions 20 are not provided between the insulating layer 72 and the fourth portions 14.

In the magnetic memory 320 according to the modification as well, each of the third portions 13 and each of the fourth portions 14 include one first region 10a and one second region 10b. The domain walls DW can be moved in one direction by the controller 60 alternately performing the first operation and the second operation.

FIG. 16A to FIG. 16D are cross-sectional views illustrating an example of a method for manufacturing the magnetic memory 320 according to the second modification of the third embodiment.

Figure 16A:
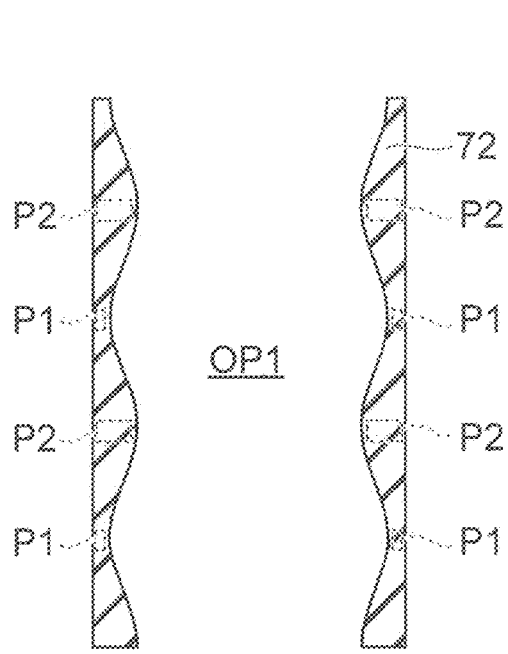
FIG. 16A to FIG. 16D are cross-sectional views illustrating an example of a method for manufacturing the magnetic memory according to the second modification of the third embodiment.

The insulating layer 72 is formed on a not-illustrated substrate. As illustrated in FIG. 16A, the opening OP1 is formed in the insulating layer 72. The opening OP1 extends in the Z-direction. The opening OP1 alternately includes a portion P1 having a large diameter, and a portion P2 having a small diameter.

Figure 16B:
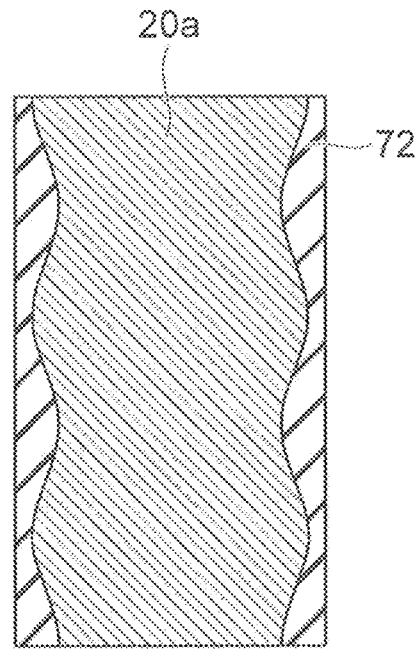

As illustrated in FIG. 16B, the metal layer 20a is formed in the interior of the opening OP1. The opening OP2 is formed in the metal layer 20a. The opening OP2 extends in the Z-direction. The opening OP2 is formed so that a portion P3 having a large diameter and a portion P4 having a small diameter are formed alternately. At this time, the opening OP2 is formed so that the positions of the portion P1 and the portion P2 are shifted from the positions of the portion P3 and the portion P4. At some of the multiple portions P4, the metal layer 20a is removed; and the insulating layer 72 is exposed.

Figure 16C:
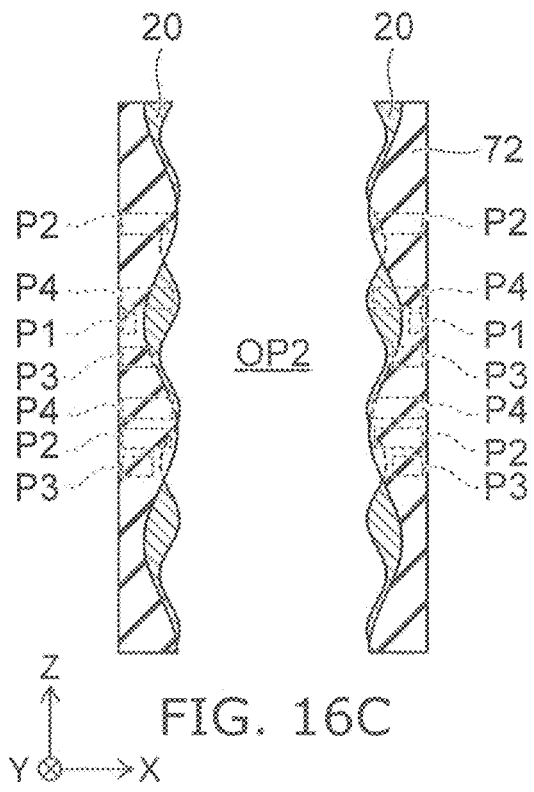

As a result, as illustrated in FIG. 16C, the first metal portion 20 is formed only at a portion of the inner wall of the opening OP2.

In FIG. 16C, the broken line shows the position where the surface would be after the etching if the insulating layer 72 were the metal layer 20a.

Figure 16D:
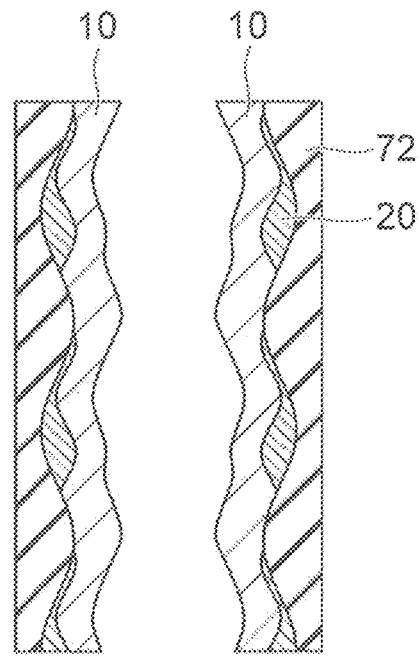

The first magnetic portion 10 is formed along the inner wall of the opening OP2. The width of the first magnetic portion 10 at the portion P1 and the portion P3 is wider than the width of the first magnetic portion 10 at the portion P2 and the portion P4. Accordingly, as illustrated in FIG. 16D, the first magnetic portion 10 that includes the multiple first regions 10a and the multiple second regions 10b is formed.

Figure 17:
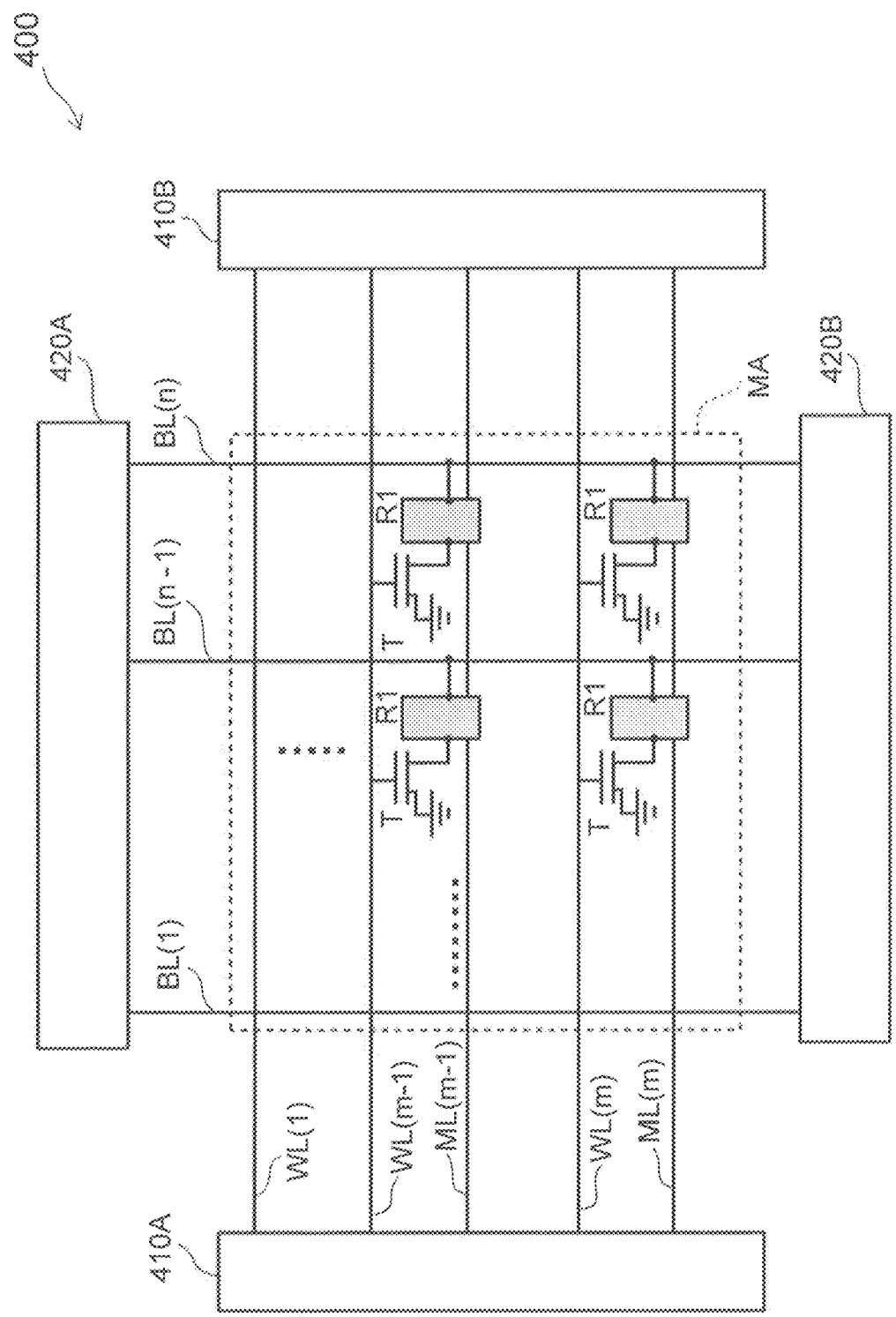
FIG. 17 is a block diagram illustrating an example of a magnetic memory array according to a fourth embodiment.

FIG. 17 is a block diagram illustrating an example of a magnetic memory array 400 according to a fourth embodiment.

Figure 18:
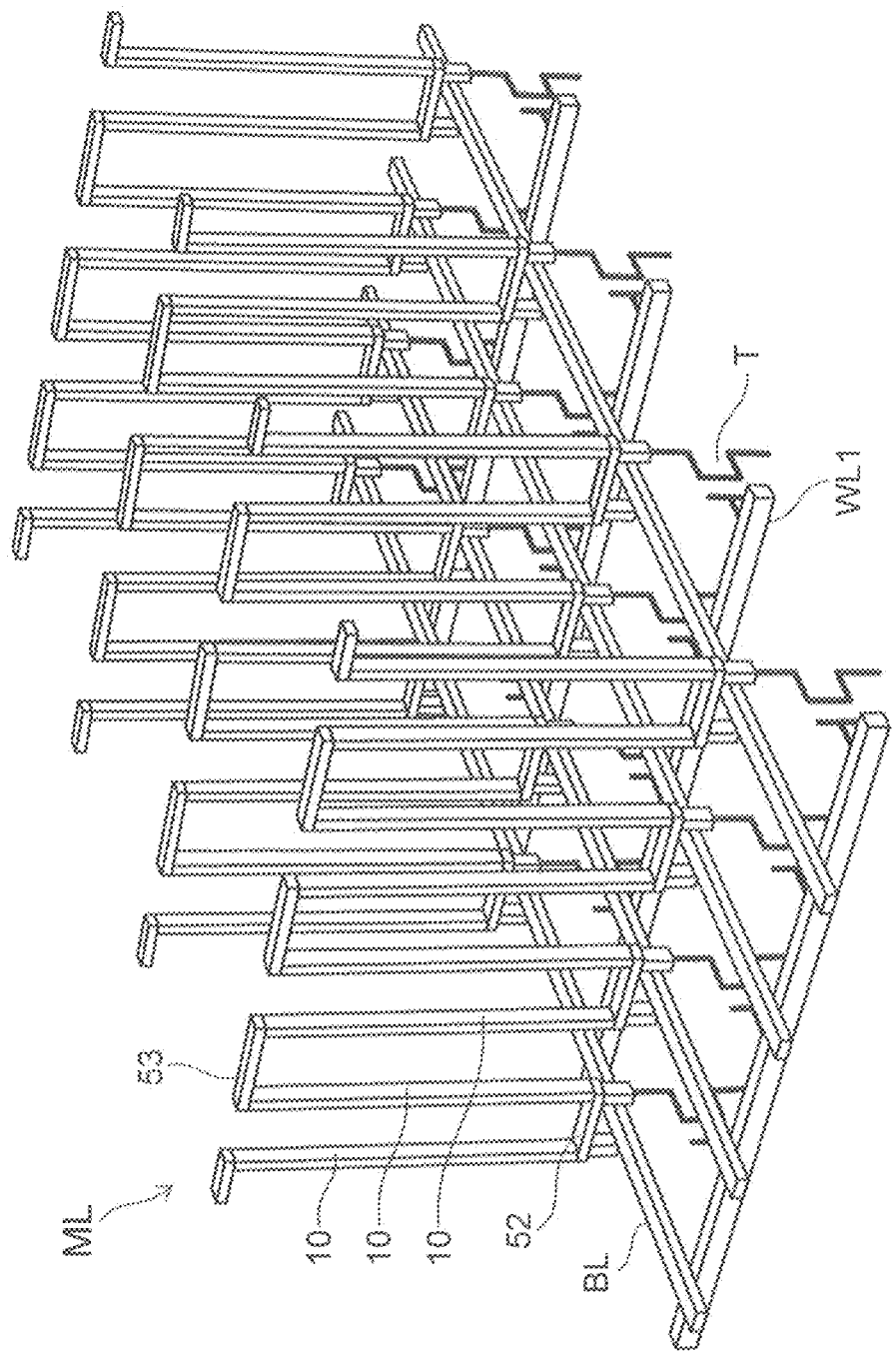
FIG. 18 is a perspective view illustrating an example of a portion of the magnetic memory array according to the fourth embodiment.

FIG. 18 is a perspective view illustrating an example of a portion of the magnetic memory array 400 according to the fourth embodiment.

Figure 19:
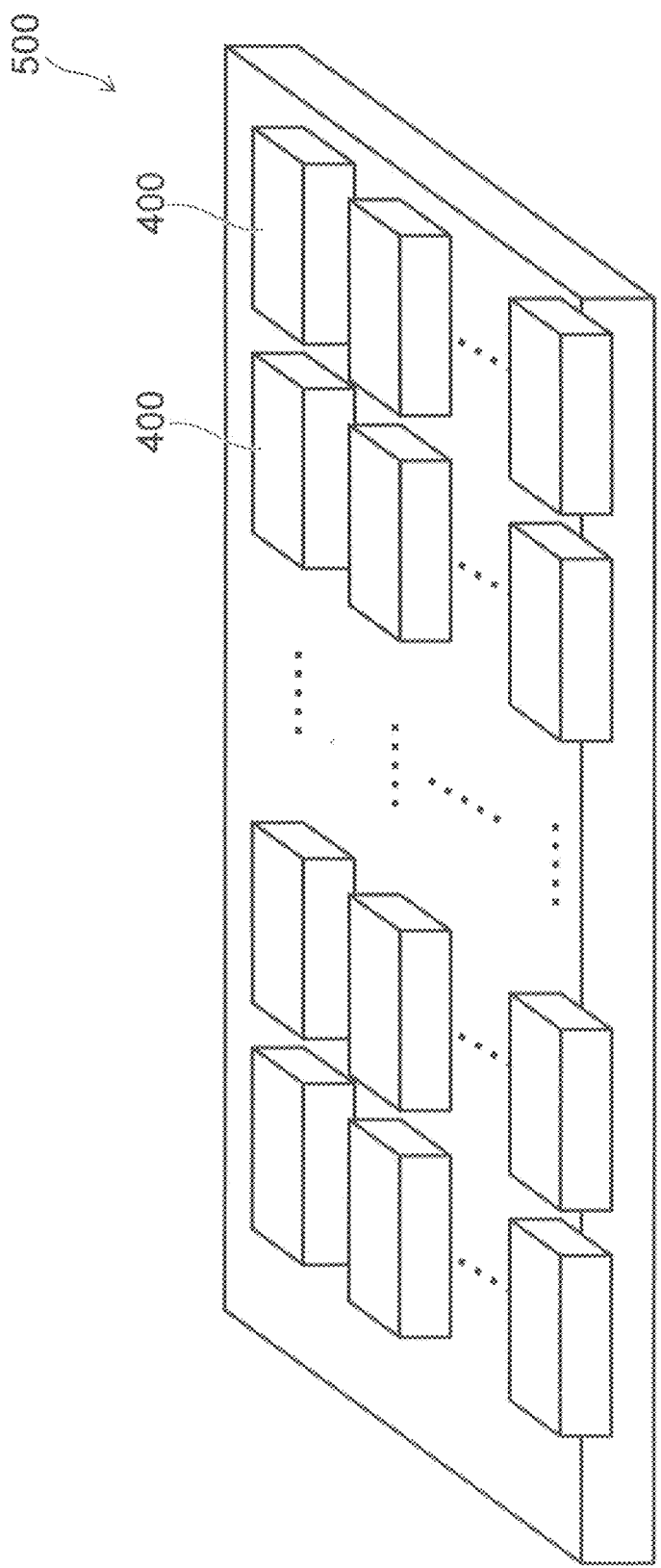
FIG. 19 is a perspective view illustrating an example of a memory chip including the magnetic memory array according to the fourth embodiment.

FIG. 19 is a perspective view illustrating an example of a memory chip including the magnetic memory array 400 according to the fourth embodiment.

The magnetic memory array 400 multiply includes a magnetic memory R1 according to any of the first to third embodiments. The magnetic memory array 400 further includes multiple switching elements T. The switching elements T are, for example, transistors. Memory tracks that each include one magnetic memory R1 and one switching element T are arranged in a matrix configuration having m rows and n columns, and are included in a memory array MA.

FIG. 18 illustrates memory tracks of four rows and four columns which are a portion of the memory array.

The n magnetic memories R1 of the ith ($1 \leq i \leq m$) row each are connected to the adjacent magnetic memories R1. A magnetic wire ML is configured by using the magnetic portions 52 and the magnetic portions 53 to connect between the magnetic memories R1. In the case where the magnetic wire ML is configured by the multiple magnetic memories R1 being connected by the magnetic portions 52 and the magnetic portions 53, each of the magnetic memories R1 may not include the first electrodes 50 and 51. It is sufficient for the first electrode 50 to be provided at one end of the magnetic wire ML, and for the second electrode 51 to be provided at the other end.

This is not limited to the example illustrated in FIG. 18; and the first magnetic portion 10 may be directly connected to a peripheral circuit described below.

As illustrated in FIG. 17, word lines WL(1) to WL(m) that are provided in each row and bit lines BL(1) to BL(n) that are provided in each column are provided in the memory array MA. The multiple word lines WL are arranged to be parallel to each other. The multiple bit lines BL are arranged to be parallel to each other. As illustrated in FIG. 18, the multiple bit lines BL extend in a direction crossing the multiple word lines WL when viewed from the Z-direction which is the extension direction of the first magnetic portion 10.

The gates of the switching elements T of each of the memory tracks are connected to the word line WL of the corresponding row. One end of the switching element T is connected to one end of the read portion 30 of the magnetic memory R1 inside the same memory track. The other end of the switching element T is grounded. The other end of the read portion 30 of the magnetic memory R1 inside the memory track is connected to the bit line BL corresponding to each of the memory tracks.

As illustrated in FIG. 17, the word lines WL(1) to WL(m) and the magnetic wires ML(1) to ML(m) are connected to a drive circuit 410B, a drive circuit 410A, and decoders that select each interconnect. The drive circuit 410A and the drive circuit 410B include write circuits, etc.

The bit lines BL(1) to BL(n) are connected to a drive circuit 420B, a drive circuit 420A, and decoders that select each interconnect. The drive circuit 420A and the drive circuit 420B include read circuits, etc.

The write portion 40 of the magnetic memory R1 is not illustrated in FIG. 17 and FIG. 18. One end of the write portion 40 is connected to a not-illustrated switching element for write selection. The other end of the write portion 40 is connected to a not-illustrated current source. The switching element for writing and the switching element for reading may be a shared switching element.

Or, one read portion 30 and one write portion 40 may be provided for multiple memory tracks. In such a case, the integration can be increased. In the case where one read portion 30 and one write portion 40 are provided in each of the memory tracks, the transfer speed of the data can be increased.

The movement of the domain walls in the magnetic memory array 400 according to the embodiment will now be described. The decoders inside the drive circuits 410A, 410B, 420A, and 420B decode the address signal input from the outside. The magnetic wire ML that corresponds to the decoded address is selected. For the selected magnetic wire ML, the first operation and the second operation are performed; and the movement of the domain walls is performed.

By such a method, the domain walls can be moved simultaneously for the multiple magnetic memories R1 that belong to the same row of the memory array MA and are included in the magnetic wire ML(/) to form the magnetic wire ML(/). In other words, the data can be moved. Thus, in the case where the magnetic memories R1 are connected to each other, the movement of the data can be performed collectively by one controller. Therefore, the power consumption of the entire memory array MA can be suppressed. The direction in which the domain walls move is the same as the direction in which the electrons flow (the reverse of the direction in which the current flows).

When writing the memory track, the decoders inside the drive circuits 410A, 410B, 420A, and 420B decode the address signal input from the outside. The word line WL that corresponds to the decoded address is selected. Thereby, the corresponding switching elements T are turned on. The writing is performed by causing a current to flow in the bit line BL. Or, the writing is performed after moving the data of the magnetic wire ML to be written. For example, it is possible to write contiguous data at a high speed by alternately performing the movement of the domain walls over the distance corresponding to one bit and the data writing of one bit.

When reading the data stored in the memory track, the decoders inside the drive circuits 410A, 410B, 420A, and 420B decode the address signal input from the outside. The magnetic wire ML that corresponds to the decoded address is selected. The shift movement of the data is performed using the method described above to move, to the position at the read portion, the bit to be read from the bit column stored as magnetization directions inside the memory track. The word line WL is selected; and the switching elements T are turned on. The reading is performed by causing a current to flow in the bit line BL. For example, it is possible to read contiguous data at a high speed by alternately and continuously performing the movement of the domain walls over the distance corresponding to one bit and the data reading of one bit. As long as the read current is smaller than the write current, the orientation of the read current may be positive or negative. This is because the stored direction of the magnetization is not reversed when reading.

FIG. 19 is a perspective view illustrating an example of a memory chip 500.

The memory chip 500 includes the multiple magnetic memory arrays 400. It is possible to realize a memory chip having more stable operations by configuring the memory chip by providing the multiple magnetic memory arrays 400 on the chip.

The embodiments may include the following configurations.

Configuration 1

A magnetic element, comprising:

a first magnetic portion including a first portion and a second portion, the first magnetic portion including a first magnetic domain and a second magnetic domain, a direction connecting the first magnetic domain and the second magnetic domain being aligned with a first direction, the first direction connecting the first portion and the second portion; and a controller performing a first operation and a second operation and being electrically connected to the first portion and the second portion, the controller in the first operation moving the first magnetic domain and the second magnetic domain from the first portion toward the second portion by supplying a first current to the first magnetic portion from the first portion toward the second portion, the controller in the second operation moving the first magnetic domain and the second magnetic domain from the first portion toward the second portion by supplying a second current to the first magnetic portion from the second portion toward the first portion.

Configuration 2

A magnetic element, comprising:

a first magnetic portion having a tubular configuration and including a first portion and a second portion, the first magnetic portion including a first magnetic domain and a second magnetic domain, a first direction being aligned with a direction connecting the first magnetic domain and the second magnetic domain, the first direction connecting the first portion and the second portion;

multiple first insulating layers provided around the first magnetic portion along a second direction and a third direction, the second direction crossing the first direction, the third direction crossing the first direction and the second direction;

multiple second insulating layers provided around the first magnetic portion along the second direction and the third direction, the multiple first insulating layers and the multiple second insulating layers being provided alternately in the first direction; and a controller performing a first operation and a second operation and being electrically connected to the first portion and the second portion, the controller in the first operation moving the first magnetic domain and the second magnetic domain from the first portion toward the second portion by supplying a first current to the first magnetic portion from the first portion toward the second portion, the controller in the second operation moving the first magnetic domain and the second magnetic domain from the first portion toward the second portion by supplying a second current to the first magnetic portion from the second portion toward the first portion.

Configuration 3

The magnetic element according to Configuration 2, wherein the first magnetic portion further includes multiple third portions and multiple fourth portions provided alternately in the first direction between the first portion and the second portion, the multiple first insulating layers are provided respectively around the multiple third portions along the second direction and the third direction, and the multiple second insulating layers are provided respectively around the multiple fourth portions along the second direction and the third direction.

Configuration 4

The magnetic element according to Configuration 3, wherein the first magnetic portion includes multiple first regions and multiple second regions provided alternately along the first direction, a length in the second direction of the first region is longer than a length in the second direction of the second region, one of the multiple third portions includes one of the multiple first regions and one of the multiple second regions, and one of the multiple fourth portions includes another one of the multiple first regions and another one of the multiple second regions.

Configuration 5

The magnetic element according to Configuration 4, wherein the one of the multiple third portions and the one of the multiple fourth portions are in contact in the first direction, and a position in the first direction of a boundary between the one of the multiple third portions and the one of the multiple fourth portions is between a position in the first direction of the one of the multiple first regions and a position in the first direction of the other one of the multiple second regions.

According to the embodiments described above, a magnetic memory and a magnetic memory array are provided in which the operations can be stabilized further.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the magnetic memory such as the first magnetic portion 10, the first metal portion 20, the second metal portion 21, the insulating portion 22, the metal layer 23, the metal layer 25, the read portion 30, the write portion 40, the first electrode 50, the second electrode 51, magnetic portions 52 and 53, the controller 60, the insulating layers 70 to 72, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all magnetic memories and all magnetic memory arrays practicable by an appropriate design modification by one skilled in the art based on the magnetic memories and the magnetic memory arrays described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory, comprising:
   a first magnetic portion including a first portion, a second portion, a plurality of third portions, and a plurality of fourth portions, the plurality of third portions and the plurality of fourth portions being provided alternately in a first direction between the first portion and the second portion, the first direction being from the first portion toward the second portion;
   a second magnetic portion;
   a first nonmagnetic portion provided between the second magnetic portion and a portion of the first magnetic portion;
   a plurality of first metal portions including a first metal material, the plurality of first metal portions respectively overlapping the plurality of third portions in a second direction crossing the first direction; and
   a controller performing a first operation and a second operation, the controller being electrically connected to the first portion and the second portion, the controller in the first operation supplying a first current to the first magnetic portion from the first portion toward the second portion, the controller in the second operation after the first operation supplying a second current to the first magnetic portion from the second portion toward the first portion,
   a first electrical resistance value can be different from a second electrical resistance value, the first electrical resistance value being a value of an electrical resistance between the second magnetic portion and the portion of the first magnetic portion before the first operation and the second operation are performed, the second electrical resistance value being a value of an electrical resistance between the second magnetic portion and the portion of the first magnetic portion after the first operation and the second operation are performed.

2. The magnetic memory according to claim 1, wherein
   the first magnetic portion includes a plurality of first regions and a plurality of second regions provided alternately along the first direction,
   a length in the second direction of the first region is longer than a length in the second direction of the second region,
   one of the plurality of third portions includes one of the plurality of first regions and one of the plurality of second regions, and one of the plurality of fourth portions includes another one of the plurality of first regions and another one of the plurality of second regions.

3. The magnetic memory according to claim 2, wherein
the one of the plurality of third portions and the one of the plurality of fourth portions are in contact in the first direction, and
a position in the first direction of a boundary between the one of the plurality of third portions and the one of the plurality of fourth portions is between a position in the first direction of the one of the plurality of first regions and a position in the first direction of the other one of the plurality of second regions.

4. The magnetic memory according to claim 1, further comprising a plurality of second metal portions including a second metal material, the second metal material being different from the first metal material,
the plurality of first metal portions and the plurality of second metal portions being provided alternately in the first direction,
the plurality of second metal portions respectively overlapping the plurality of fourth portions in the second direction.

5. The magnetic memory according to claim 4, wherein
the first metal portion includes at least one material selected from the group consisting of Au, Ir, Al, Pb, Ta, W, and Hf, and
the second metal portion includes at least one material selected from the group consisting of Pt, Pd, and Rh.

6. The magnetic memory according to claim 1, further comprising a plurality of insulating portions,
the plurality of first metal portions and the plurality of insulating portions being provided alternately in the first direction,
the plurality of insulating portions respectively overlapping the plurality of fourth portions in the second direction.

7. The magnetic memory according to claim 1, wherein an orientation of a magnetization of the first magnetic portion is aligned with the second direction.

8. The magnetic memory according to claim 1, wherein
the first magnetic portion further includes a plurality of first regions and a plurality of second regions provided alternately along the first direction,
a length in a second direction of the first region being longer than a length in the second direction of the second region, the second direction crossing the first direction,
one of the plurality of third portions including one of the plurality of first regions and one of the plurality of second regions,
one of the plurality of fourth portions including another one of the plurality of first regions and another one of the plurality of second regions.

9. The magnetic memory according to claim 8, wherein
the one of the plurality of third portions and the one of the plurality of fourth portions are in contact in the first direction, and
a position in the first direction of a boundary between the one of the plurality of third portions and the one of the plurality of fourth portions is between a position in the first direction of the one of the plurality of first regions and a position in the first direction of the other one of the plurality of second regions.

10. The magnetic memory according to claim 8, wherein
each of the plurality of first metal portions includes a third region and a fourth region, a thickness in the second direction of the fourth region being thicker than a thickness in the second direction of the third region,
the third region included in the one of the plurality of first metal portions is provided around the one of the plurality of first regions included in the one of the plurality of third portions, and
the fourth region included in the one of the plurality of first metal portions is provided around the one of the plurality of second regions included in the one of the plurality of third portions.

11. The magnetic memory according to claim 10, further comprising:
a third magnetic portion; and
a second nonmagnetic portion provided between the third magnetic portion and another portion of the first magnetic portion.

12. The magnetic memory according to claim 1, further comprising a plurality of second metal portions including a second metal material, the second metal material being different from the first metal material,
the plurality of first metal portions and the plurality of second metal portions being provided alternately in the first direction,
the plurality of second metal portions being provided respectively around the plurality of fourth portions.

13. The magnetic memory according to claim 12, further comprising:
a plurality of first insulating layers; and
a plurality of second insulating layers,
the plurality of first insulating layers being provided respectively around the plurality of first metal portions,
the plurality of second insulating layers being provided respectively around the plurality of second metal portions,
the plurality of first insulating layers including the first metal material.

14. The magnetic memory according to claim 1, wherein the controller performs a third operation between the first operation and the second operation, the controller in the third operation not causing a current to flow between the first portion and the second portion.

15. The magnetic memory according to claim 1, wherein
the controller performs a third operation between the first operation and the second operation,
the controller in the third operation supplies a third current to the first magnetic portion, the third current having an orientation from the first portion toward the second portion or an orientation from the second portion toward the first portion, and
the absolute value of a current value of the third current is less than the absolute value of a current value of the first current and less than the absolute value of a current value of the second current.

16. A magnetic memory array, comprising:
a plurality of the magnetic memories according to claim 1;
a word line;
a switching element including a first terminal, a second terminal, and a gate, the first terminal being electrically connected to the first portion of one of the plurality of magnetic memories, the second terminal being connected to a fixed potential, the gate being connected to the word line; and
a bit line electrically connected to the second portion of the one of the plurality of magnetic memories,
the controller being electrically connected to the word line and the gate.

17. A magnetic memory, comprising:
a first magnetic portion including a first portion, a second portion, a plurality of third portions, and a plurality of fourth portions, the plurality of third portions and the plurality of fourth portions being provided alternately in a first direction between the first portion and the second portion, the first direction being from the first portion toward the second portion, the first magnetic portion having a tubular configuration;
a second magnetic portion;
a first nonmagnetic portion provided between the second magnetic portion and a portion of the first magnetic portion;
a plurality of first metal portions including a first metal material, the plurality of first metal portions being provided respectively around the plurality of third portions; and
a controller performing a first operation and a second operation, the controller being electrically connected to the first portion and the second portion, the controller in the first operation supplying a first current to the first magnetic portion from the first portion toward the second portion, the controller in the second operation after the first operation supplying a second current to the first magnetic portion from the second portion toward the first portion,
a first electrical resistance value can be different from a second electrical resistance value, the first electrical resistance value being a value of an electrical resistance between the second magnetic portion and the portion of the first magnetic portion before the first operation and the second operation are performed, the second electrical resistance value being a value of an electrical resistance between the second magnetic portion and the portion of the first magnetic portion after the first operation and the second operation are performed.

* * * * *